(12) United States Patent
Liu et al.

(10) Patent No.: US 10,497,847 B2
(45) Date of Patent: Dec. 3, 2019

(54) STRUCTURE AND MANUFACTURING METHOD OF HEAT DISSIPATION SUBSTRATE AND PACKAGE STRUCTURE AND METHOD THEREOF

(71) Applicant: Unimicron Technology Corp., Taoyuan (TW)

(72) Inventors: Wen-Fang Liu, Taoyuan (TW); Shao-Chien Lee, Taipei (TW); Chen-Wei Tseng, New Taipei (TW); Zong-Hua Li, Taoyuan (TW)

(73) Assignee: Unimicron Technology Corp., Taoyuan (TW)

( * ) Notice: Subject to any disclaimer, the term of this patent is extended or adjusted under 35 U.S.C. 154(b) by 0 days.

(21) Appl. No.: 15/826,702

(22) Filed: Nov. 30, 2017

(65) Prior Publication Data

US 2019/0067543 A1    Feb. 28, 2019

(30) Foreign Application Priority Data

Aug. 30, 2017    (TW) .............................. 106129499 A

(51) Int. Cl.
*H01L 33/00* (2010.01)
*H01L 33/64* (2010.01)
(Continued)

(52) U.S. Cl.
CPC ............ *H01L 33/642* (2013.01); *H01L 33/62* (2013.01); *H01L 25/0753* (2013.01);
(Continued)

(58) Field of Classification Search
CPC ..... H01L 33/642; H01L 33/62; H01L 33/647; H01L 25/0753; H01L 2924/15311;
(Continued)

(56) References Cited

U.S. PATENT DOCUMENTS 9,480,173 B2 * 10/2016 Ishihara ............... H05K 3/4691
2016/0029488 A1 * 1/2016 Kang .................... H05K 1/056
174/262

(Continued)

FOREIGN PATENT DOCUMENTS

JP    2002043500    2/2002
JP    2004214428    7/2004
(Continued)

OTHER PUBLICATIONS

"Office Action of Taiwan Counterpart Application", dated Jun. 12, 2018, p. 1-p. 11.

*Primary Examiner* — Ismail A Muse
(74) *Attorney, Agent, or Firm* — JCIPRNET

(57) ABSTRACT

A heat dissipation substrate structure includes a multilayer circuit board including a core board and build-up boards, a heat conduction layer, a cavity structure, bonding pads, and vias. The heat conduction layer is disposed within the core board, or on a surface of the core board, or on a surface of one of the build-up boards. The cavity structure is in the multilayer circuit board with respect to the heat conduction layer and exposes a first surface of the heat conduction layer. The bonding pads are on the surface of the multilayer circuit board at a side of a second surface of the heat conduction layer. The portions of the vias are connected to portions of the bonding pads and the heat conduction layer. Accordingly, heat flow can be distributed via a heat dissipation path from the bonding pads through the vias to the heat conduction layer.

20 Claims, 21 Drawing Sheets

(51) Int. Cl.
*H01L 33/62* (2010.01)
*H01L 25/075* (2006.01)
(52) U.S. Cl.
CPC .... *H01L 33/647* (2013.01); *H01L 2933/0066* (2013.01); *H01L 2933/0075* (2013.01)
(58) Field of Classification Search
CPC ... H01L 2224/16225; H01L 2933/0066; H01L 2933/0075
See application file for complete search history.

(56) References Cited

U.S. PATENT DOCUMENTS

| | | | |
|---|---|---|---|
| 2016/0374189 A1* | 12/2016 | Lee | H05K 1/0209 |
| 2017/0141744 A1* | 5/2017 | Kim | H01L 23/49827 |
| 2017/0194300 A1* | 7/2017 | Lin | H01L 23/34 |
| 2017/0207200 A1* | 7/2017 | Lin | H01L 25/50 |
| 2019/0237382 A1* | 8/2019 | Kim | H01L 21/4857 |

FOREIGN PATENT DOCUMENTS

| | | |
|---|---|---|
| TW | I377653 | 11/2012 |
| TW | 201436130 | 9/2014 |
| TW | 201709570 | 3/2017 |

* cited by examiner

STRUCTURE AND MANUFACTURING METHOD OF HEAT DISSIPATION SUBSTRATE AND PACKAGE STRUCTURE AND METHOD THEREOF

CROSS-REFERENCE TO RELATED APPLICATION

This application claims the priority benefit of Taiwan application serial no. 106129499, filed on Aug. 30, 2017. The entirety of the above-mentioned patent application is hereby incorporated by reference herein and made a part of this specification.

BACKGROUND OF THE INVENTION

Field of the Invention

The invention relates to the manufacture and design of a heat dissipation substrate, and more particularly, to a heat dissipation substrate structure and a manufacturing method thereof.

Description of Related Art

In current electronic products, in order to meet the small, lightweight, and multifunction trend, a plurality of IC devices often needs to be integrated in a limited area in the circuit substrate design, and how to disperse waste heat generated during the operation of the IC devices is an important topic.

A current improvement method includes designing a package substrate having a cavity structure and placing the IC devices in the cavity structure and including a heat dissipating material to achieve the object of substrate heat dissipation; alternatively, a thermally enhanced circuit board having a built-in heat sink and a build-up circuit is used to place the IC devices on the heat sink structure to achieve the heat dissipation object.

SUMMARY OF THE INVENTION

The invention provides a heat dissipation substrate structure that can rapidly release the heat flow of a heating device to the environment to prevent the accumulation of a large amount of heat in the device and a multilayer circuit board from affecting the operation of an electronic product.

The invention further provides a package structure that can effectively dissipate heat.

The invention further provides a manufacturing method of a heat dissipation substrate that can manufacture a heat dissipation substrate having good heat dissipation effect and suitable for mass production.

The invention further provides a packaging method that can easily be used with the heat dissipation substrate structure to achieve an effective heat dissipation effect.

The heat dissipation substrate structure of the invention includes a multilayer circuit board, at least one heat conduction layer, at least one cavity structure, a plurality of bonding pads, and a plurality of vias. The multilayer circuit board includes a core board and a plurality of build-up boards, and each of the build-up boards is respectively disposed on two surfaces of the core board. The heat conduction layer is disposed within the core board, on one surface of the core board, or on one surface of one of the plurality of build-up boards. The heat conduction layer has a first surface and a second surface opposite to the first surface. The cavity structure is formed in the multilayer circuit board with respect to the heat conduction layer and exposes the first surface of the heat conduction layer. The bonding pads are disposed on the surface of the multilayer circuit board at a side of the second surface of the heat conduction layer. The vias are formed in the multilayer circuit board, wherein at least a portion of the vias is connected to portions of the bonding pads and the second surface of the heat conduction layer.

In an embodiment of the invention, the size of the cavity structure is the same as the area of the first surface of the heat conduction layer.

In an embodiment of the invention, the area of the first surface of the heat conduction layer is greater than the size of the cavity structure.

In an embodiment of the invention, the heat conduction layer can be a single-layer structure or a multilayer structure.

In an embodiment of the invention, the heat conduction layer is embedded in the core board.

In an embodiment of the invention, the heat conduction layer is formed on the surface of one of the plurality of build-up boards.

In an embodiment of the invention, the heat conduction layer is formed on the surface of the core board.

In an embodiment of the invention, the heat conduction layer and the cavity structure can be one heat conduction layer paired with a plurality of cavity structures.

In an embodiment of the invention, the heat conduction layer and the cavity structure can be a plurality of heat conduction layers paired with a plurality of cavity structures, and each of the heat conduction layers is paired with one cavity structure.

In an embodiment of the invention, each of the build-up boards includes a dielectric material layer and a conductive material layer.

The package structure of the invention includes the heat dissipation substrate structure, at least one device, and a plurality of bonding materials. The device is disposed on the multilayer circuit board of the side of the second surface of the heat conduction layer with respect to the cavity structure of the heat dissipation substrate structure. The bonding materials are disposed on the surface of the device facing the multilayer circuit board and connected to the bonding pads.

In yet another embodiment of the invention, the device and the cavity structure include a plurality of devices paired with one cavity structure.

In yet another embodiment of the invention, the device and the cavity structure include a plurality of devices paired with a plurality of cavity structures, and each of the devices is paired with one cavity structure.

In yet another embodiment of the invention, the package structure can further include a carrier board between the device and the bonding materials to carry a plurality of the device, wherein the carrier board is connected to the bonding pads via the bonding materials.

The manufacturing method of a heat dissipation substrate of the invention includes forming a multilayer circuit board, including respectively forming a plurality of build-up boards on two surfaces of a core board, wherein at least one heat conduction layer is disposed within the core board, on a surface of the core board, or on a surface of one of the plurality of build-up boards when forming the multilayer circuit board; forming a plurality of vias passing through a surface of the multilayer circuit board, wherein a portion of the vias is connected to a second surface of the at least one heat conduction layer; forming a plurality of bonding pads on the surface of the multilayer circuit board, wherein each of the bonding pads is connected to the portion of the vias; and forming at least one cavity structure in the multilayer circuit board with respect to the heat conduction layer to expose the first surface of the heat conduction layer, wherein the first surface is opposite to the second surface.

In another embodiment of the invention, a method of forming the vias includes a blind via process or a through hole process.

In another embodiment of the invention, the step of forming the cavity structure includes exposing an entirety of the first surface of the heat conduction layer.

In another embodiment of the invention, the step of forming the cavity structure includes exposing a portion of the first surface of the heat conduction layer.

In another embodiment of the invention, a method of disposing the heat conduction layer includes embedding the heat conduction layer having a single-layer structure or a multilayer structure in the core board.

In another embodiment of the invention, a method of disposing the heat conduction layer includes embedding the heat conduction layer having a single-layer structure or a multilayer structure on the surface of the core board.

In another embodiment of the invention, a method of disposing the heat conduction layer includes embedding the heat conduction layer having a single-layer structure or a multilayer structure on the surface of one of the plurality of build-up boards.

The packaging method of the invention includes providing the heat dissipation substrate structure and then bonding at least one device to the bonding pads through a plurality of bonding materials formed on thereof for forming a heat dissipation path from the device through the bonding materials, the bonding pads, and the vias to the heat dissipation layer.

In yet another embodiment of the invention, when the device is a plurality of devices, a method of bonding the device to the bonding pads includes bonding a plurality of devices to the bonding pads of the multilayer circuit board at the same time using a mass production method.

In yet another embodiment of the invention, when the device is a plurality of devices, a method of bonding the device to the bonding pads includes first bonding a plurality of devices to a carrier board, wherein the carrier board has a plurality of solder balls; and then bonding the solder balls to the bonding pads of the multilayer circuit board.

In the embodiments of the invention above, the bonding materials include solder balls.

Based on the above, in the invention, via a special design, the heat flow generated by a heating device is transferred to the heat conduction layer from the vias in the multilayer circuit board and then transferred to the environment by a heat conduction layer. As a result, not only can heat flow transfer distance be reduced, the heat conduction layer can rapidly release the heat flow to the environment to prevent the accumulation of a large amount of heat in the device and the multilayer circuit board from affecting the operation of an electronic product. Moreover, if a material having higher rigidity is used as the heat conduction layer, then the structure can also achieve the effect of increasing the mechanical strength of the multilayer circuit board having a cavity structure design. Moreover, since the location of the device and the cavity structure are respectively on different surfaces of the multilayer circuit board and bonding material structures such as solder balls are used, when the heat dissipation substrate of the invention is applied in an LED display panel or the like, in addition to heat dissipation effects, the effect of uniform display brightness is also achieved because the surface on which the device (such as an LED device) is placed is flat and without cavities.

In order to make the aforementioned features and advantages of the disclosure more comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
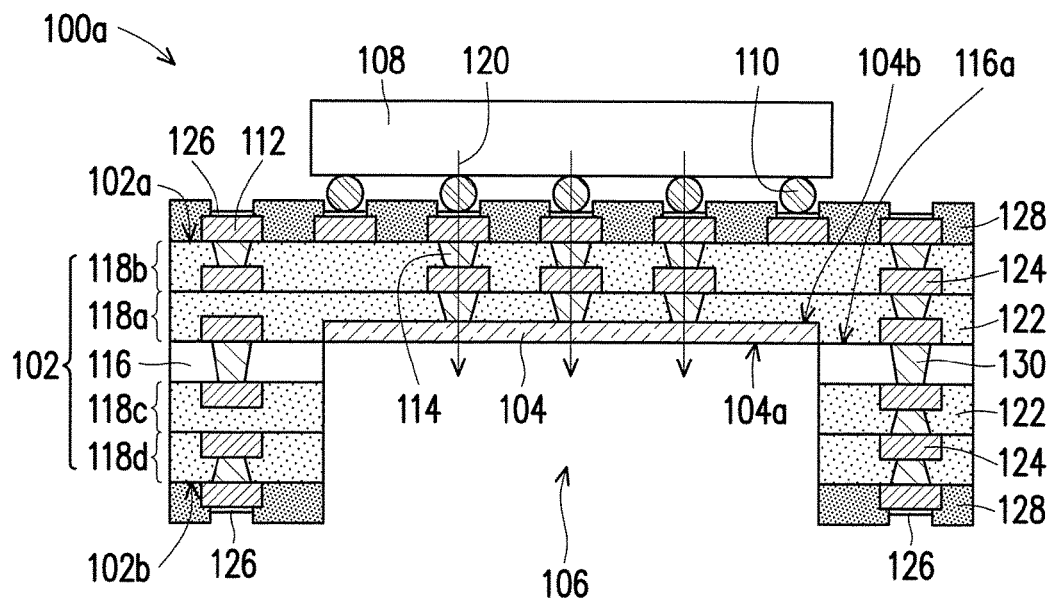
FIG. 1A, FIG. 1B, and FIG. 1C are cross sections of three package structures according to the first embodiment of the invention.

Some embodiments are provided hereinafter and described in detail with reference to figures. However, the embodiments provided are not intended to limit the scope of the invention. Moreover, the figures are only descriptive and are not drawn to scale. For ease of explanation, the same devices below are provided with the same reference numerals. Moreover, terms such as "contain", "include", and "have" used in the specification are all open terms, i.e., contains, but not limited to. Moreover, directional terms used in the specification such as "on," "over," "below," and "under" are only directions used in the figures. Therefore, the directional terms are used to illustrate and are not intended to limit the invention.

FIG. 1A is a cross section of a package structure according to the first embodiment of the invention.

Referring to FIG. 1A, a heat dissipation substrate structure 100a in the first embodiment includes a multilayer circuit board 102, a heat conduction layer 104, a cavity structure 106, a plurality of bonding pads 112, and a plurality of vias 114. The package structure of the first embodiment includes the heat dissipation substrate structure 100a and a device 108 thereon, and the device 108 is connected to the bonding pads 112 via bonding materials 110. The multilayer circuit board 102 generally includes a core board 116 and a plurality of build-up boards 118a-d, wherein the build-up boards 118a and 118b are disposed on one surface of the core board 116, the build-up boards 118c and 118d are disposed on the other surface of the core board 116, and although 4 build-up boards 118a-d are shown in the figure, the invention is not limited thereto, and the number of the build-up board can be changed based on design requirements. The location of the heat conduction layer 104 can be on a surface of the core board 116, within the core board 116, or on a surface of one of the plurality of build-up boards 118a-d; in the first embodiment, the heat conduction layer 104 is formed on a surface 116a of the core board 116, and the heat conduction layer 104 has a first surface 104a and a second surface 104b opposite to the first surface 104a. The cavity structure 106 is formed in the multilayer circuit board 102 with respect to the heat conduction layer 104 and exposes the first surface 104a of the heat conduction layer 104. In the first embodiment, the size (e.g. the contour area perpendicular to the thickness direction) of the cavity structure 106 is the same as the area of the first surface 104a of the heat conduction layer 104. The bonding pads 112 are disposed on the surface of the multilayer circuit board 102 at a side of the second surface 104b of the heat conduction layer 104. The vias 114 are formed in the multilayer circuit board 102, wherein the vias 114 are connected to portions of the bonding pads 112 and the second surface 104b of the heat conduction layer 104. In the present embodiment, the device 108 is disposed on the multilayer circuit board 102 at the side of the second surface 104b of the heat conduction layer 104 with respect to the cavity structure 106; and the bonding materials 110 are disposed on the surface of the device 108 facing the multilayer circuit board 102. When the heating device 108 is connected to the bonding pads 112 via the bonding materials 110, a heat dissipation path 120 from the device 108 through the bonding materials 110, the bonding pads 112, and the vias 114 to the heat conduction layer 104 can be obtained.

Referring further to FIG. 1A, the core layer 116 can be an insulating material such as a ceramic material, epoxy resin, modified epoxy resin, polyester, acrylate, fluorine polymer, polyphenylene oxide, polyimide, phenolic resin, silicone polymer, BT resin, cyanate polyester, polyethylene, or a combination of the polymers. Each of the build-up boards 118a-d has, for instance, a dielectric material layer 122 and a conductive material layer 124. The dielectric material layer 122 can be an insulating material such as a ceramic material, epoxy resin, modified epoxy resin, polyester, acrylate, fluorine polymer, polyphenylene oxide, polyimide, phenolic resin, silicone polymer, BT resin, cyanate polyester, polyethylene, or a combination of the polymers. The conductive material layer 124 can be a metal, including copper, or other conductive materials, including metallic or non-metallic material. The material of the vias 114 can also be a metal, including copper, or other conductive materials, including metallic or non-metallic material. Moreover, based on the process, the vias 114 can include blind holes or through holes, and in the present embodiment, the vias 114 are preferably blind holes. For instance, the vias 114 can be manufactured with the conductive material layer 124 during the build-up of the build-up boards 118a and 118b. For instance, after the conductive material layer 124 of the build-up board 118a is formed, the dielectric material layer 122 of the build-up board 118a can be penetrated by laser without penetrating the heat conduction layer 104, and then copper or other materials having conductive properties is formed at the penetrated portion. Then, after forming the dielectric material layer 122 of the build-up board 118b, the dielectric material layer 122 of the build-up board 118b is penetrated by laser without penetrating the conductive material layer 124, and then copper or other materials having conductive properties is formed at the penetrated portion, and then the bonding pads 112 are formed. As a result, the vias 114 are stacked vias formed by stacking a plurality of single-layer blind holes located in different dielectric material layers as shown in FIG. 1A.

In the present embodiment, the heat conduction layer 104 is a single-layer structure, and the heat conduction layer 104 can be a material having electric conduction and heat conduction properties, such as a conductive metal such as gold, silver, aluminum, copper, or nickel or carbon compound; the heat conduction layer 104 can also be a material having insulation and heat conduction properties such as boron nitride, silicon carbide, aluminum nitride, aluminum oxide, diamond film, diamond aluminum composite, graphite aluminum composite, carbon fiber aluminum composite, silicon carbide aluminum composite, or a composite material of the above. Moreover, in the present embodiment, an antioxidant layer 126 can be further disposed on the surface of each of the bonding pads 112 to prevent the oxidation of the bonding pads 112. The heat dissipation substrate structure 100a can further include a solder mask 128 covering the surface 102a of the multilayer circuit board 102 facing the device 108 and exposing the surface of each of the bonding pads 112, and a solder mask 128 can also be disposed on the other surface of the multilayer circuit board 102 having the cavity structure 106 to cover the surface 102b of the multilayer circuit board 102 other than the cavity structure 106.

Since in the first embodiment, heat flow generated by the heating device 108 is transferred from the bonding materials 110 to the vias 114 in the multilayer circuit board 102 and then transferred to the heat conduction layer 104 for heat dissipation, not only can heat flow transfer distance be reduced, the heat conduction layer 104 can also rapidly release the heat flow to the environment to prevent the accumulation of a large amount of heat in the device 108 and the multilayer circuit board 102 from affecting the operation of an electronic product. Moreover, the device 108 can also be connected to a circuit in the multilayer circuit board 102 via portions of the bonding materials 110 (such as solder balls) and achieve the function of signal transmission via the conductive material layer 124 and the vias 130 therein. For instance, FIG. 1A has five bonding materials 110, wherein only three are connected to the heat conduction layer 104 for forming the heat dissipation path 120, and the other two are connected to a circuit (not shown) in the multilayer circuit board 102 via the bonding pads 112 for signal transmission.

Figure 1B:
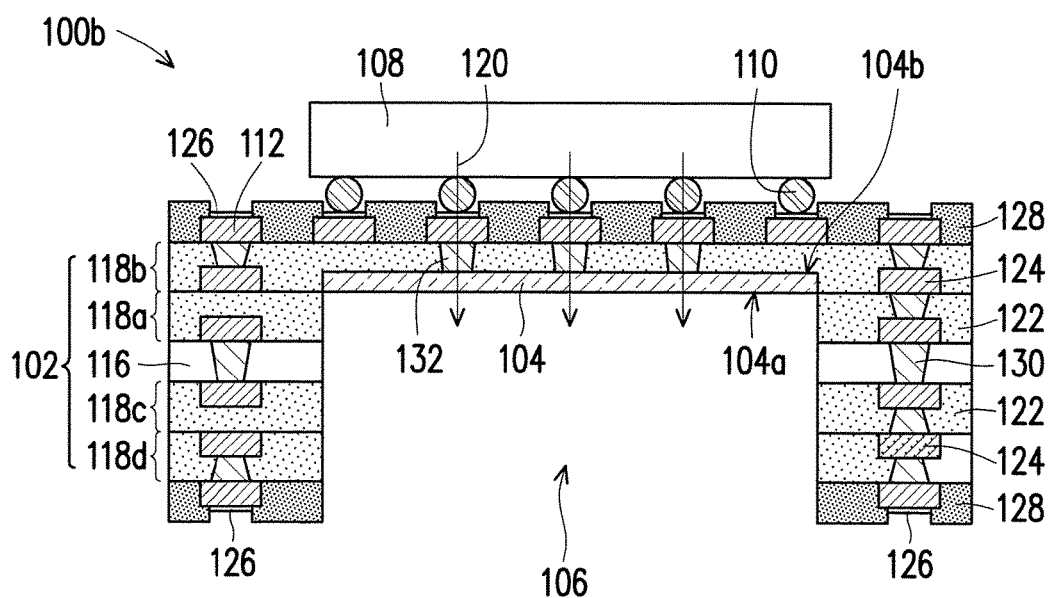

FIG. 1B is a cross section of another package structure of the first embodiment, wherein the same reference numerals as FIG. 1A are used to represent the same or similar devices, and descriptions of the same technical content are omitted.

In a heat dissipation substrate structure 100b of FIG. 1B, the heat conduction layer 104 is formed on one of the two surfaces of the build-up board 118a closer to a side of the device 108. Therefore, vias 132 are formed in the build-up board 118b in the multilayer circuit board 102 and connected to the bonding pads 112, wherein a portion of the vias 132 is connected to the second surface 104b of the heat conduction layer 104 to obtain a heat dissipation path 120 shorter than FIG. 1A.

Figure 1C:
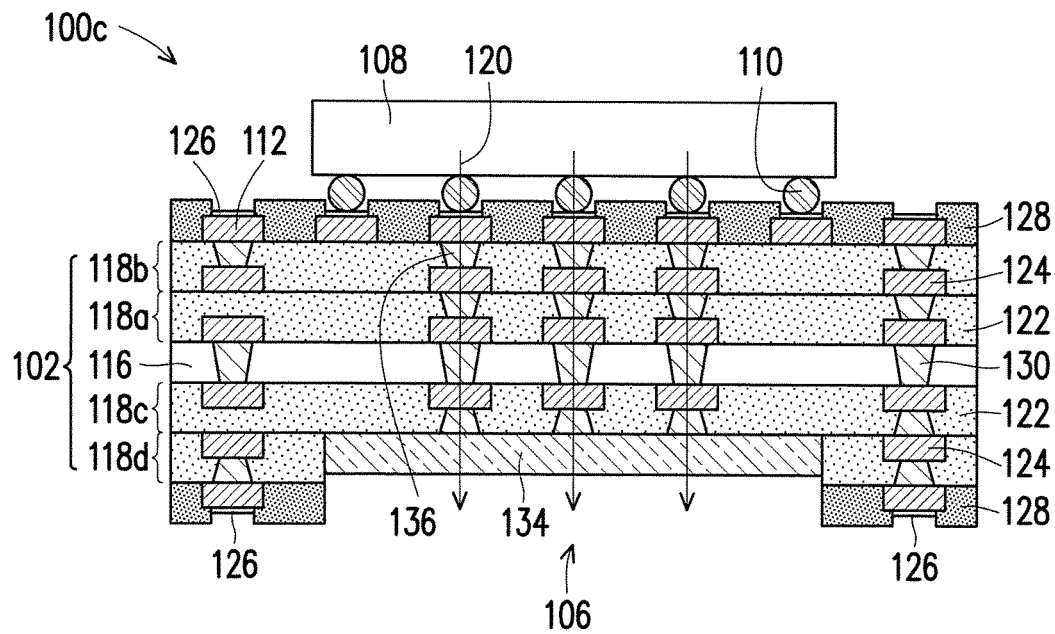

FIG. 1C is a cross section of yet another package structure of the first embodiment, wherein the same reference numerals as FIG. 1A are used to represent the same or similar devices, and descriptions of the same technical content are omitted.

In a heat dissipation substrate structure 100c of FIG. 1C, the heat conduction layer 134 is formed on the surface of the build-up board 118c far away a side of the device 108. Therefore, vias 136 are formed in the build-up boards 118a, 118b, and 118c in the multilayer circuit board 102, and vias 130 are formed in the core board 116. A portion of the vias 136 and a portion of the vias 130 are connected to obtain a heat dissipation path 120 from the bonding pads 112 to the heat conduction layer 134. The heat dissipation path 120 is longer than FIG. 1A, and the heat conduction layer 134 can be a thicker structure.

Figure 2:
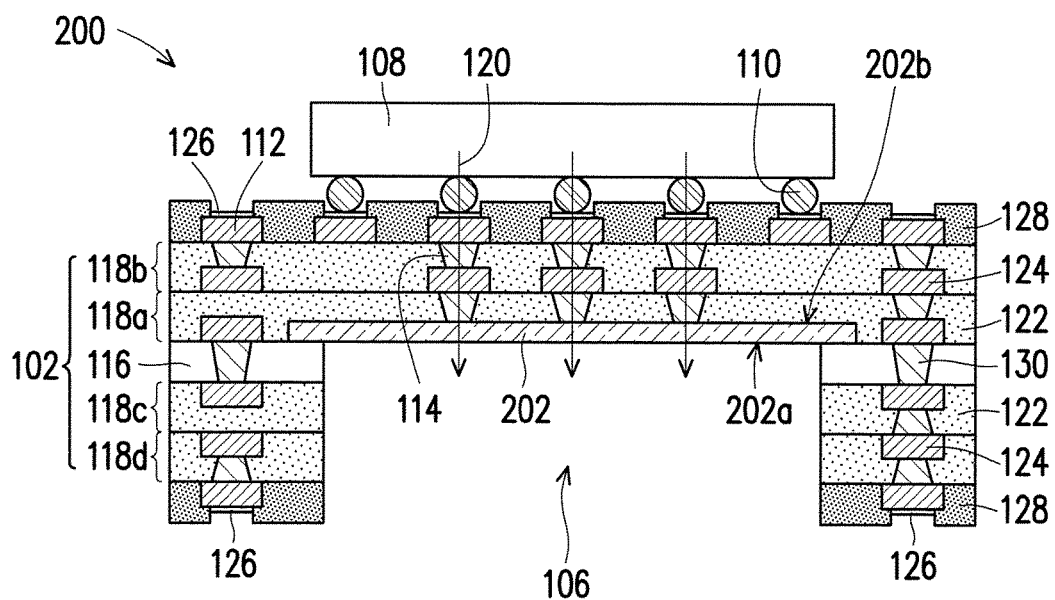
FIG. 2 is a structural cross section of another example of the heat dissipation substrate of FIG. 1A.

FIG. 2 is a structural cross section of another example of the heat dissipation substrate of FIG. 1A, wherein the same reference numerals as FIG. 1A are used to represent the same devices, and descriptions of the same technical content are omitted. In a heat dissipation substrate structure 200 of FIG. 2, the area of a first surface 202a of a heat conduction layer 202 is greater than the size of the cavity structure 106. If a material having higher rigidity is used as the heat conduction layer 202, then the structure can also achieve the effect of increasing the mechanical strength of the multilayer circuit board 102 having the cavity structure 106 design.

Figure 3A:
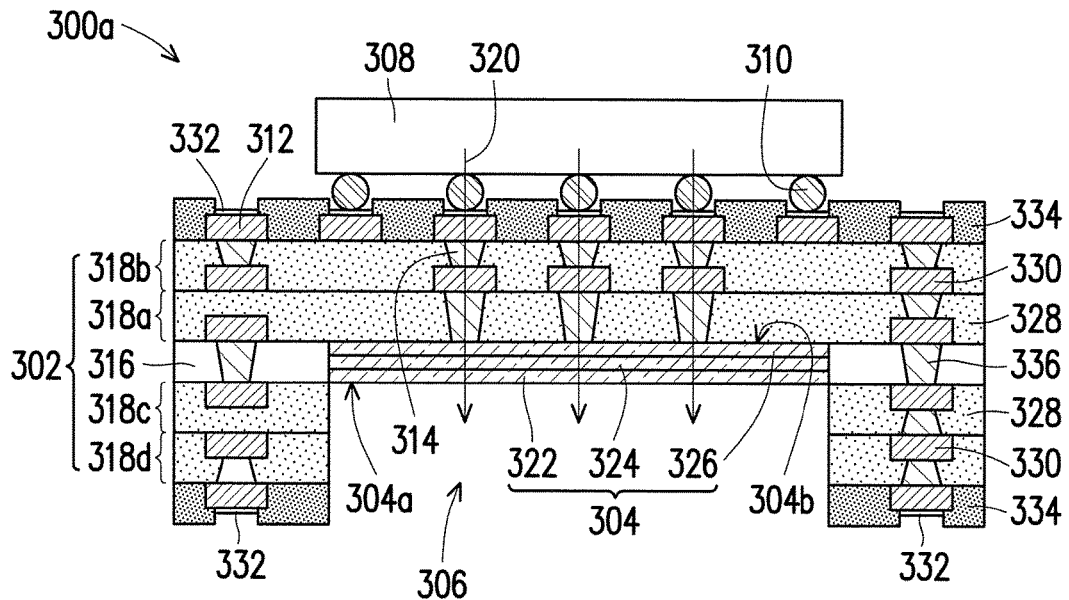
FIG. 3A, FIG. 3B, and FIG. 3C are cross sections of three package structures according to the second embodiment of the invention.

FIG. 3A is a cross section of a package structure according to the second embodiment of the invention.

Referring to FIG. 3A, a heat dissipation substrate structure 300a in the second embodiment includes a multilayer circuit board 302, a heat conduction layer 304, a cavity structure 306, a plurality of bonding pads 312, and a plurality of vias 314. The package structure of the second embodiment includes the heat dissipation substrate structure 300a and a device 308 thereon, and the device 308 can be connected to the bonding pads 312 via bonding materials 310. The multilayer circuit board 302 includes a core board 316 and a plurality of build-up boards 318a-d. In the second embodiment, the heat conduction layer 304 is embedded in the core board 316 and the heat conduction layer 304 has a first surface 304a and a second surface 304b opposite to the first surface 304a. The cavity structure 306 is formed in the multilayer circuit board 302 with respect to the heat conduction layer 304 and exposes the first surface 304a of the heat conduction layer 304. The bonding pads 312 are disposed on the surface of the multilayer circuit board 302 at a side of the second surface 304b of the heat conduction layer 304. The vias 314 are formed in the multilayer circuit board 302, wherein the vias 314 are connected to portions of the bonding pads 312, and a portion of the vias 314 is connected to the second surface 304b of the heat conduction layer 304. In the present embodiment, the device 308 is disposed on the multilayer circuit board 302 at the side of the second surface 304b of the heat conduction layer 304 with respect to the cavity structure 306; and the bonding materials 310 are disposed on the surface of the device 308 facing the multilayer circuit board 302. When the heating device 308 is connected to the bonding pads 312 via the bonding materials 310, a heat dissipation path 320 from the device 308 through the bonding materials 310, the bonding pads 312, and the vias 314 to the heat conduction layer 304 can be obtained.

In the second embodiment, the heat conduction layer 304 is a multilayer structure, such as a structural layer containing a first material layer 322, a second material layer 324, and a third material layer 326, wherein the first, second, and third material layers 322, 324, and 326 can be materials having electric conduction and heat conduction properties, such as a conductive metal such as gold, silver, aluminum, copper, or nickel or carbon compound; the first, second, and third material layers 322, 324, and 326 can also be materials having insulation and heat conduction properties such as boron nitride, silicon carbide, aluminum nitride, aluminum oxide, diamond film, diamond aluminum composite, graphite aluminum composite, carbon fiber aluminum composite, silicon carbide aluminum composite, or a composite material of the above. The first, second, and third material layers 322, 324, and 326 can be the same or different. For instance, the second material layer 324 is at least different from the first material layer 322 or the third material layer 326, but the invention is not limited thereto. In the second embodiment, the heat conduction layer 304 of the multilayer structure can also be the single-layer structure of the first embodiment.

Referring again to FIG. 3A, the size of the cavity structure 306 is the same as the area of the first surface 304a of the heat conduction layer 304. The core layer 316 can be an insulating material such as a ceramic material, epoxy resin, modified epoxy resin, polyester, acrylate, fluorine polymer, polyphenylene oxide, polyimide, phenolic resin, silicone polymer, BT resin, cyanate polyester, polyethylene, or a combination of the polymers. Each of the build-up boards 318a-d includes a dielectric material layer 328 and a conductive material layer 330, wherein the dielectric material layer 328 can be an insulating material such as a ceramic material, epoxy resin, modified epoxy resin, polyester, acrylate, fluorine polymer, polyphenylene oxide, polyimide, phenolic resin, silicone polymer, BT resin, cyanate polyester, polyethylene, or a combination of the polymers; and the conductive material layer 330 can be a metal including copper or other conductive materials, including metallic or non-metallic material.

In the second embodiment, the vias 314 include blind holes or through holes, and in FIG. 3A, stacked vias formed by stacking a plurality of single-layer blind holes located in different dielectric material layers are exemplified. The material of the vias 314 can be a metal including copper or other conductive materials, including metallic or non-metallic material. Moreover, the heat dissipation substrate 300a can further include an antioxidant layer 332 disposed on the surface of each of the bonding pads 312. In the present embodiment, the heat dissipation substrate 300a can further include a solder mask 334 covering the surface of the multilayer circuit board 302 facing the device 308 and exposing the surface of the bonding pads 312 and the antioxidant layer 332. Since in the second embodiment, heat flow generated by the heating device 308 is transferred to the vias 314 in the multilayer circuit board 302 via the bonding materials 310 and then transferred to the heat conduction layer 304 for heat dissipation, the heat dissipation layer 304 can rapidly release the heat flow to the environment to prevent the accumulation of a large amount of heat in the device 308 and the multilayer circuit board 302. Moreover, the device 308 can also be connected to a circuit in the multilayer circuit board 302 via portions of the bonding materials 310 (such as solder balls) and achieve the function of signal transmission via the conductive material layer 330 and the vias 336 therein.

Figure 3B:
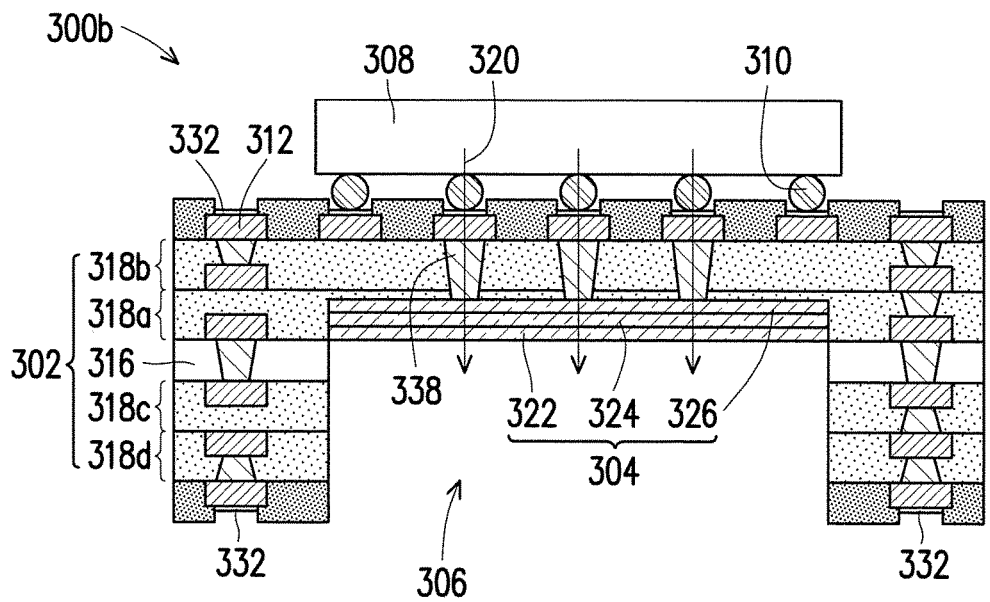

FIG. 3B is a cross section of another package structure of the second embodiment, wherein the same reference numerals as FIG. 3A are used to represent the same or similar devices, and descriptions of the same technical content are omitted.

In a heat dissipation substrate structure 300b of FIG. 3B, the heat conduction layer 304 is on the surface of the core board 316. Therefore, vias 338 are single-layer blind holes formed in the build-up boards 318a and 318b of the multilayer circuit board 302 and connected to the bonding pads 312 and the heat conduction layer 304 for obtaining a heat dissipation path 320 shorter than FIG. 3A.

Figure 3C:
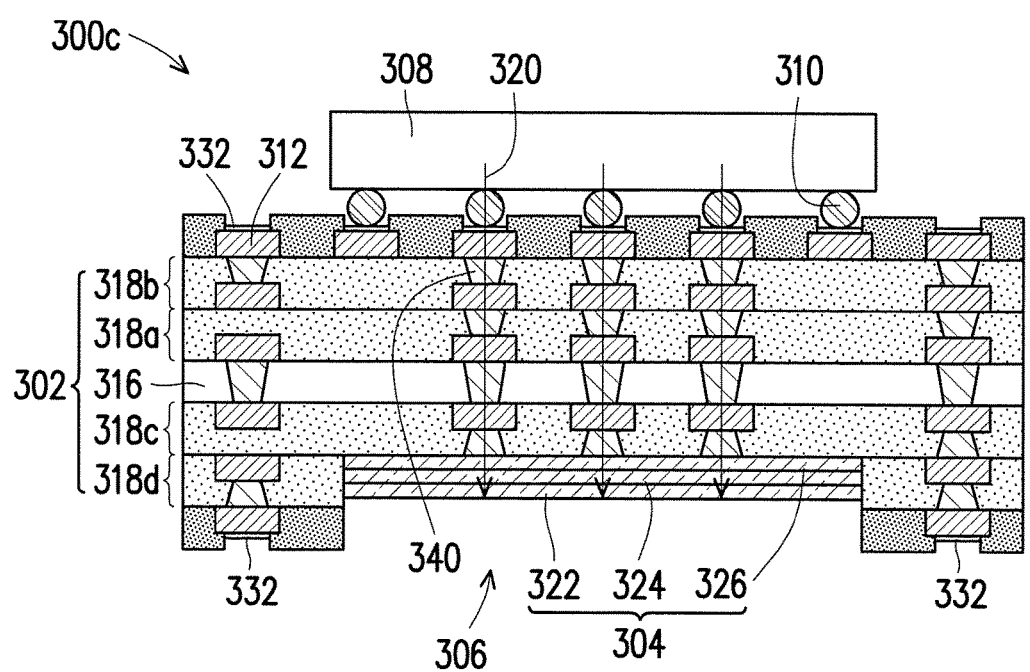

FIG. 3C is a cross section of another package structure of the second embodiment, wherein the same reference numerals as FIG. 3A are used to represent the same or similar devices, and descriptions of the same technical content are omitted.

In a heat dissipation substrate structure 300c of FIG. 3C, the heat conduction layer 304 is on a surface of the build-up board 318c far away the device 308. Therefore, vias 340 are formed in the build-up boards 318a, 318b, and 318c in the multilayer circuit board 302 and the core board 316, and portions of the vias 340 are connected to the bonding pads 312 and the heat conduction layer 304 for obtaining a heat dissipation path 320 longer than FIG. 3A.

Figure 4:
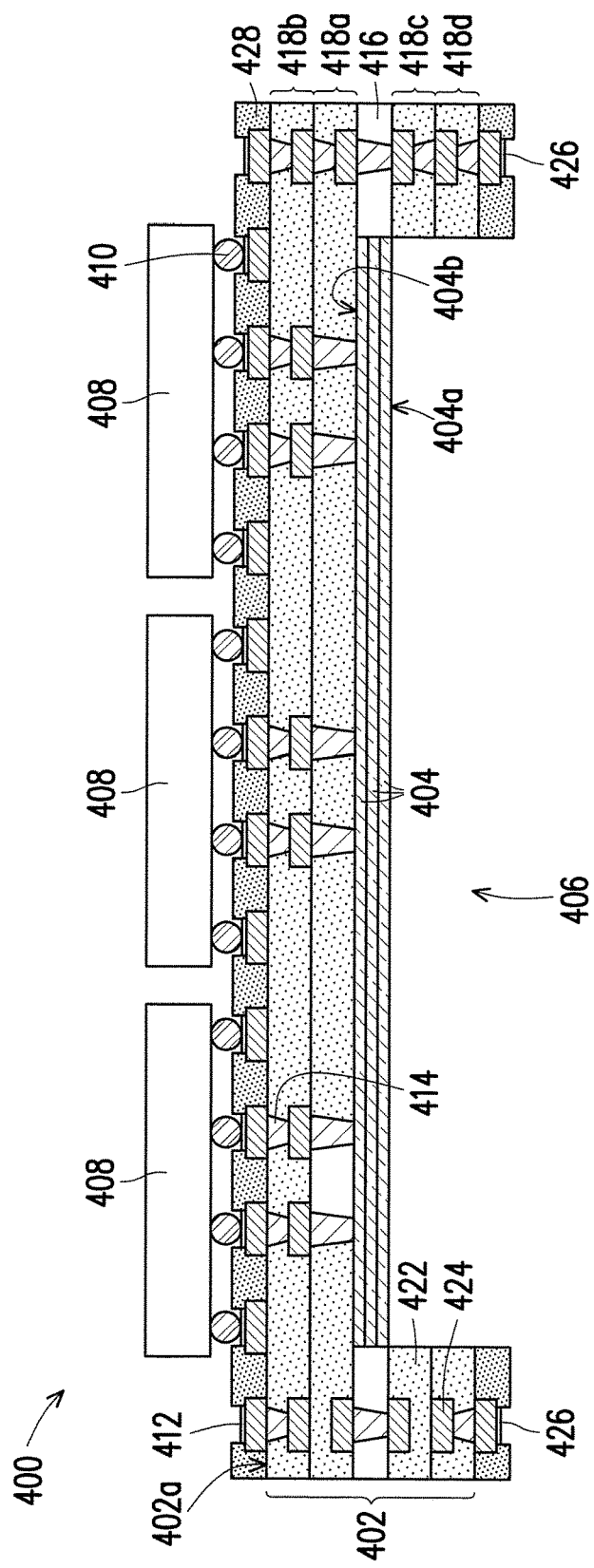
FIG. 4 is a cross section of a package structure according to the third embodiment of the invention.

FIG. 4 is a cross section of a package structure according to the third embodiment of the invention.

In FIG. 4, a heat dissipation substrate structure 400 includes a multilayer circuit board 402, a heat conduction layer 404, a cavity structure 406, a plurality of bonding pads 412, and a plurality of vias 414. The package structure of the third embodiment includes a heat dissipation substrate structure 400 and a plurality of devices 408 connected to the bonding pads 412 with the bonding materials 410. The multilayer circuit board 402 includes a core board 416 and a plurality of build-up boards 418a-d, and the build-up boards 418a-d are respectively disposed on two surfaces of the core board 416. The heat conduction layer 404 is embedded in the core board 416, but the invention is not limited thereto. Alternatively, the heat conduction layer 404 can be disposed on a surface of the core board 416 or on a surface of one of the build-up boards 418a-d. The cavity structure 406 is formed in the multilayer circuit board 402 with respect to the heat conduction layer 404 and exposes a first surface 404a of the heat conduction layer 404. The bonding pads 412 are disposed on a surface 402a of the multilayer circuit board 402 at a side of the second surface 404b of the heat conduction layer 404. The vias 414 are stacked vias formed in the multilayer circuit board 402 and formed by stacking a plurality of single-layer blind holes located in different dielectric material layers, wherein a portion of the vias 414 is connected to portions of the bonding pads 412 and the second surface 404b of the heat conduction layer 404. In the present embodiment, a plurality of the device 408 is disposed on the multilayer circuit board 402 at the side of the second surface 404b of the heat conduction layer 404 with respect to the cavity structure 406; and the bonding materials 410 are disposed on the surface of the devices 408 facing the multilayer circuit board 402. When the devices 408 are connected to the bonding pads 412 via the bonding materials 410, a heat dissipation path from the devices 408 through the bonding materials 410, the bonding pads 412, and the vias 414 to the heat conduction layer 404 can be obtained.

In the third embodiment, the size of the cavity structure 406 is the same as the area of the heat conduction layer 404; and the heat conduction layer 404 is a multilayer structure. Descriptions of other components similar to or the same as the above embodiments are as provided above, such as the dielectric material layer 422, the conductive material layer 424, the antioxidant layer 426, and the solder mask 428, which are not repeated in the present embodiment.

Since the location of the devices 408 and the cavity structure 406 of the third embodiment are respectively on different surfaces of the multilayer circuit board 402 and the bonding materials 410 structure such as solder balls is used, when the heat dissipation substrate structure 400 is applied in an LED display panel or the like, in addition to having heat dissipation effect, since the surface (i.e., the surface 402a) on which the devices 408 (such as LED devices) are placed is flat and without cavities, in comparison to other designs in which the cavities and the devices are disposed on the same surface, the adjacent devices 408 design of the present embodiment can also have the effect of uniform display brightness.

Figure 5:
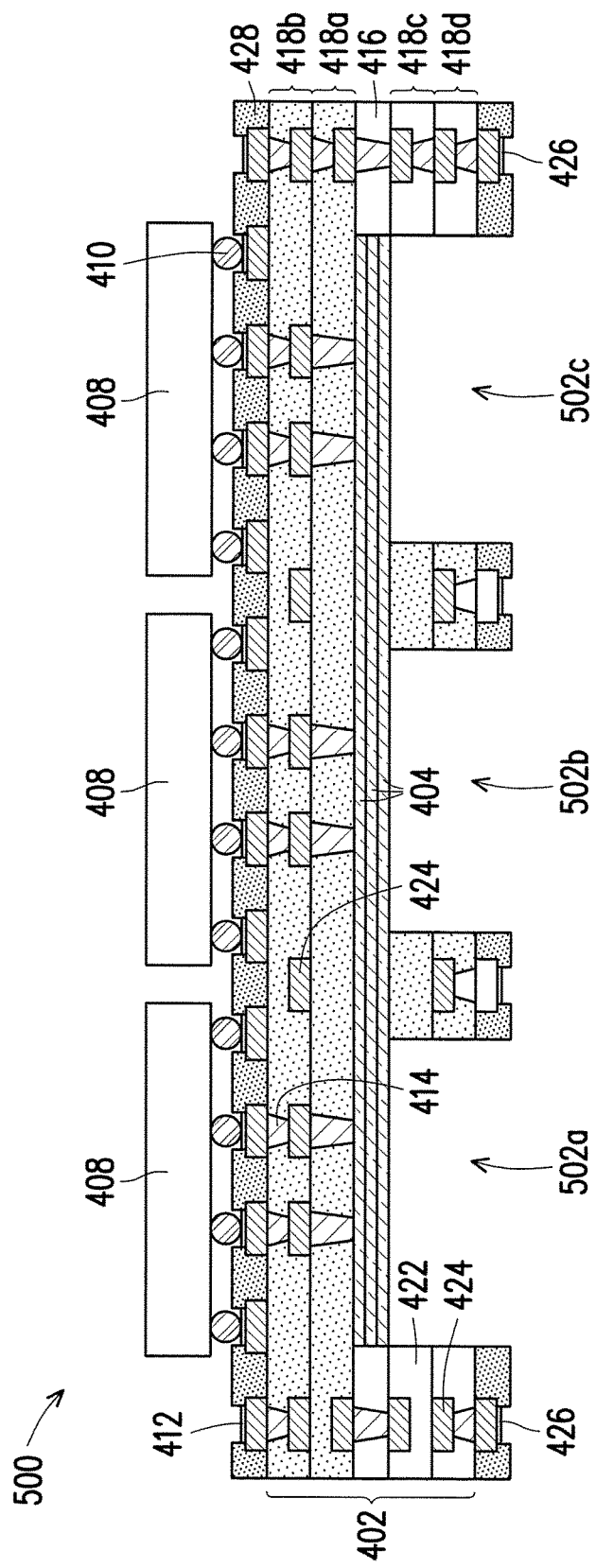
FIG. 5 is a cross section of a package structure according to the fourth embodiment of the invention.

FIG. 5 is a cross section of a package structure according to the fourth embodiment of the invention, wherein the reference numerals and some of the content of the third embodiment are adopted and the same reference numerals are used to represent the same or similar devices and descriptions of the same technical content are omitted. The omitted portions are as described in the above embodiments and are not repeated in the present embodiment.

Referring to FIG. 5, the difference from the third embodiment is that a heat dissipation substrate structure 500 has a plurality of cavity structures 502a, 502b, and 502c. The cavity structures 502a, 502b, and 502c respectively correspond to a plurality of devices 408, each of the devices 408 is paired with one of the cavity structures 502a, 502b, and 502c, and the number of the heat conduction layer 404 is still one.

Figure 6:
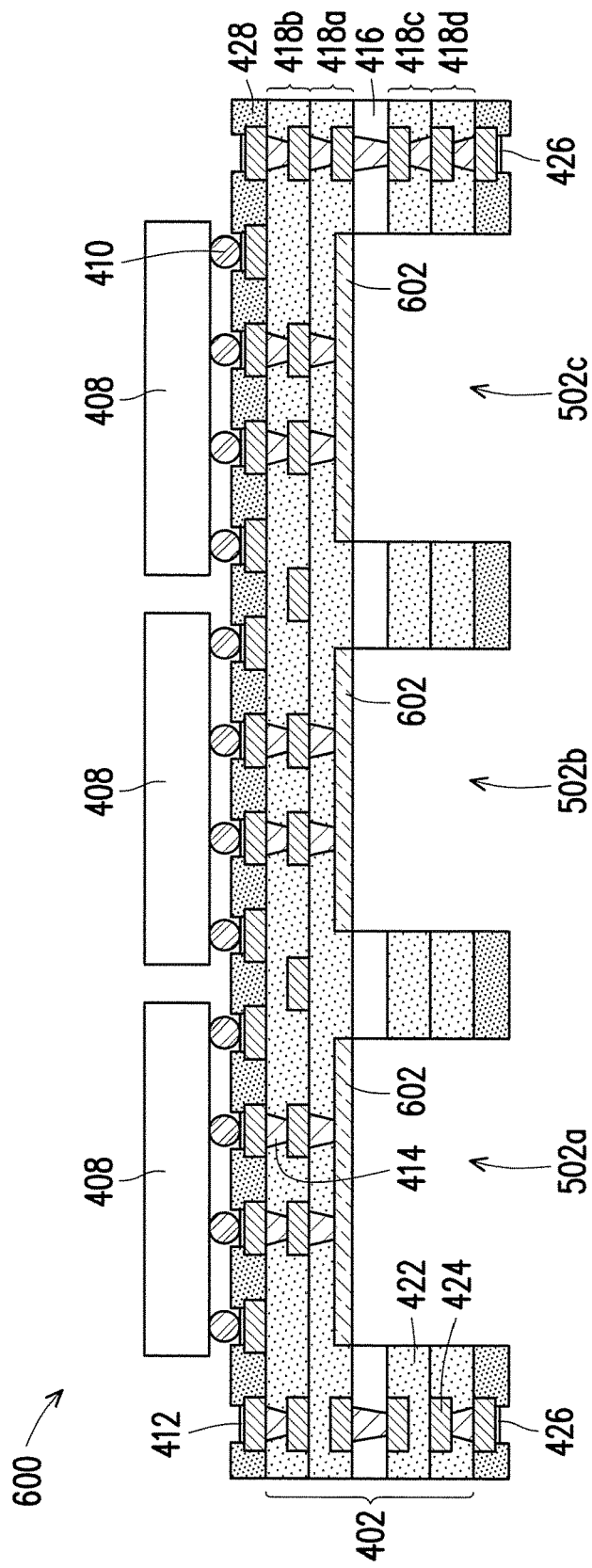
FIG. 6 is a cross section of a package structure according to the fifth embodiment of the invention.

FIG. 6 is a cross section of a package structure according to the fifth embodiment of the invention, wherein the reference numerals and some of the content of the fourth embodiment are adopted and the same reference numerals are used to represent the same or similar devices and descriptions of the same technical content are omitted. The omitted portions are as described in the above embodiments and are not repeated in the present embodiment.

Referring to FIG. 6, the difference from the fourth embodiment is that a heat dissipation substrate structure 600 includes a plurality of heat conduction layers 602 paired with a plurality of cavity structures 502a-c, and each of the heat conduction layers 602 is paired with one of the cavity structures 502a-c. The plurality of cavity structures 502a-c can be paired with a plurality of devices 408, and each of the devices 408 is paired with one of the cavity structures 502a-c. In the present embodiment, the heat conduction layer 602 is a single-layer structure and is formed on the surface of the core board 416.

Figure 7:
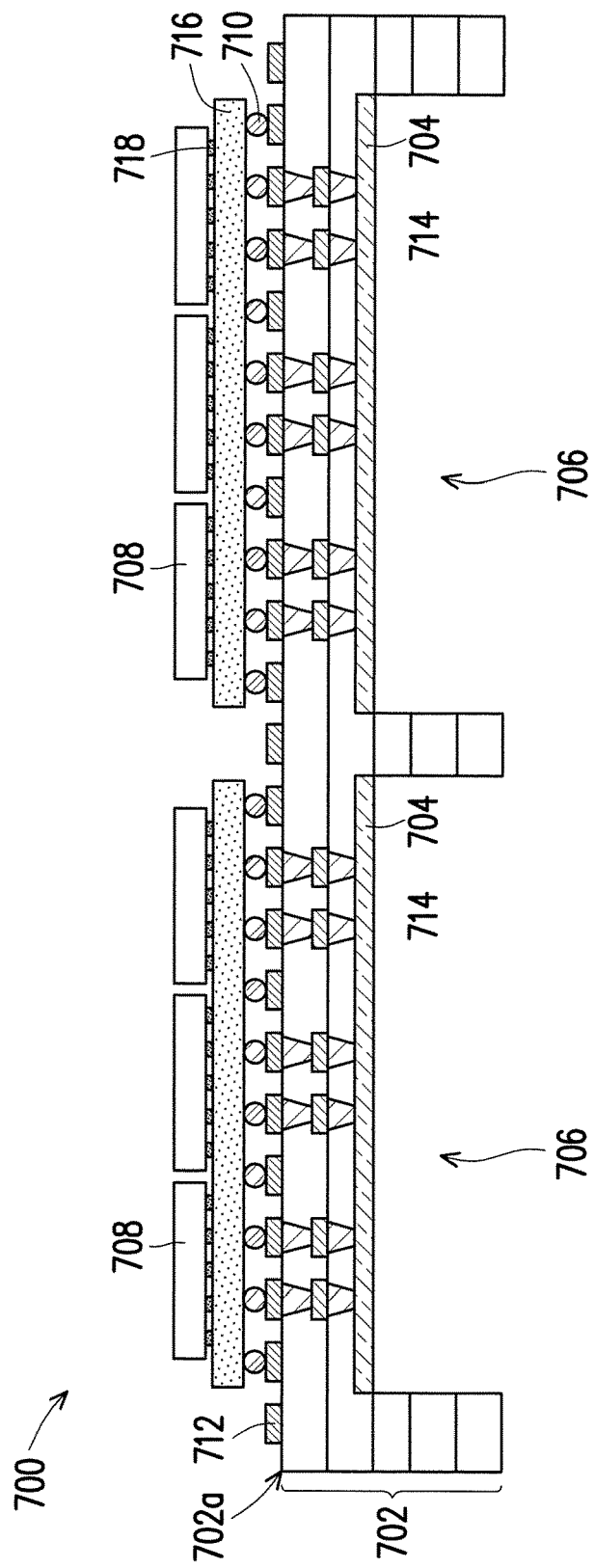
FIG. 7 is a cross section of a package structure according to the sixth embodiment of the invention.

FIG. 7 is a cross section of a package structure according to the sixth embodiment of the invention, wherein for clarity, some of the unnecessary components are omitted.

In FIG. 7, a heat dissipation substrate structure 700 includes a multilayer circuit board 702, a plurality of heat conduction layers 704, a plurality of cavity structures 706, a plurality of bonding pads 712, and a plurality of vias 714. The package structure of the sixth embodiment includes the heat dissipation substrate structure 700 and a plurality of devices 708 thereon, and a carrier board 716 is disposed between the devices 708 and the heat dissipation substrate structure 700 to carry the plurality of devices 708, and the carrier board 716 is connected to the bonding pads 712 via bonding materials 710. Therefore, the sixth embodiment is suitable for mass production. In other words, if a large number of the device 708 is to be disposed on a surface 702a of the multilayer circuit board 702, then the plurality of devices 708 can be first connected to the carrier board 716 via a contact 718. The carrier board 716 is similar to a small circuit board and has a circuit and bonding materials 710 such as solder balls. Next, a carrier board 716 in which the devices 708 are installed in blocks can be bonded to the surface 702a of the multilayer circuit board 702. The omitted portions are as described in the above embodiments and are not repeated in the present embodiment.

In the manufacturing method of the heat dissipation substrate of the invention, a multilayer circuit board needs to be first formed, and at least one heat dissipation layer is disposed within one or on a surface of the core board and the plurality of build-up boards thereof. For instance, FIG. 8A to FIG. 8G are cross sections of the manufacturing process of forming a heat dissipation substrate structure according to the seventh embodiment of the invention; and FIG. 8H shows a packaging schematic using the heat dissipation substrate structure of the seventh embodiment.

Figure 8A:
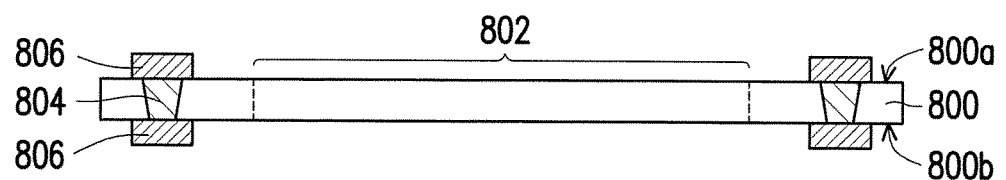
FIG. 8A to FIG. 8G are cross sections of the manufacturing process of a heat dissipation substrate structure according to the seventh embodiment of the invention.

Referring first to FIG. 8A, a core board 800 is prepared, wherein the core board 800 has opposite surfaces 800a and 800b, and an opening is formed in an opening region 802 using mechanical drilling, laser, or other methods. A circuit 806 is formed on the surfaces 800a and 800b of the core board 800 using a patterning process with a blind via process or a through hole process, and vias 804 are formed in the core board 800. The material of the circuit 806 can be a metal including copper or other conductive materials including metallic or non-metallic material. The manufacture in the steps of the present figure can be implemented by well-known technique.

Figure 8B:
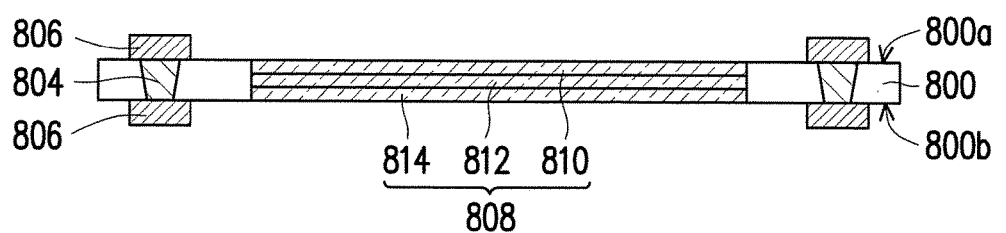

Next, referring to FIG. 8B, a heat conduction layer 808 having a multilayer structure is embedded in the core board 800. The heat conduction layer 808 can be a structural layer containing a first material layer 810, a second material layer 812, and a third material layer 814, wherein the first, second, and third material layers 810, 812, and 814 can be materials having electric conduction and heat conduction properties, such as a conductive metal such as gold, silver, aluminum, copper, or nickel or carbon compound; the first, second, and third material layers 810, 812, and 814 can also be materials having insulation and heat conduction properties such as boron nitride, silicon carbide, aluminum nitride, aluminum oxide, diamond film, diamond aluminum composite, graphite aluminum composite, carbon fiber aluminum composite, silicon carbide aluminum composite, or a composite material of the above. The first, second, and third material layers 810, 812, and 814 can be the same or different. For instance, the second material layer 812 is at least different from the first material layer 810 or the third material layer 814, but the invention is not limited thereto.

Figure 8C:
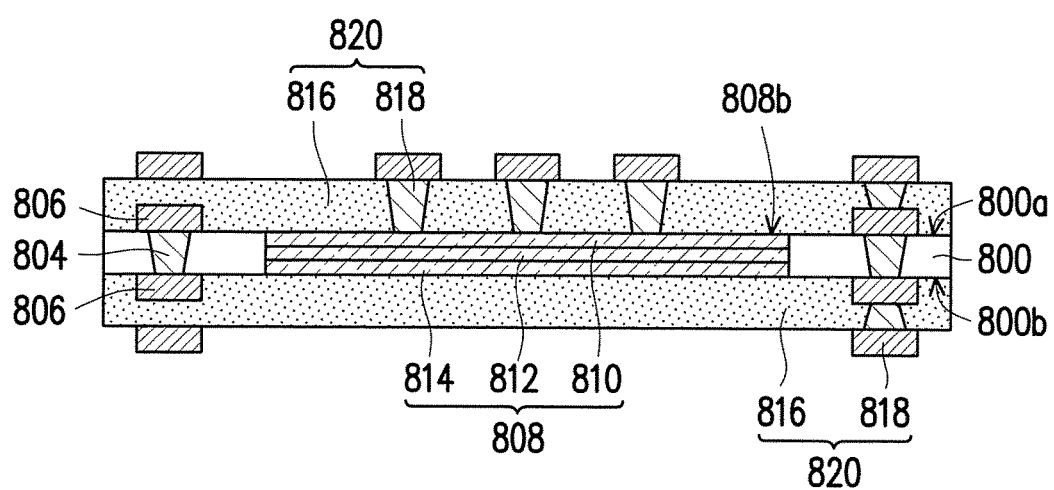

Next, referring to FIG. 8C, a build-up process is performed on two surfaces 800a and 800b of the core board 800 by using a dielectric material layer 816 and a conductive material layer 818 to form a plurality of build-up boards 820. The method of the build-up includes, for instance, first forming a dielectric material layer 816 and a conductive material layer 818, and then performing a patterning process and/or a blind via process or through hole process.

Figure 8D:
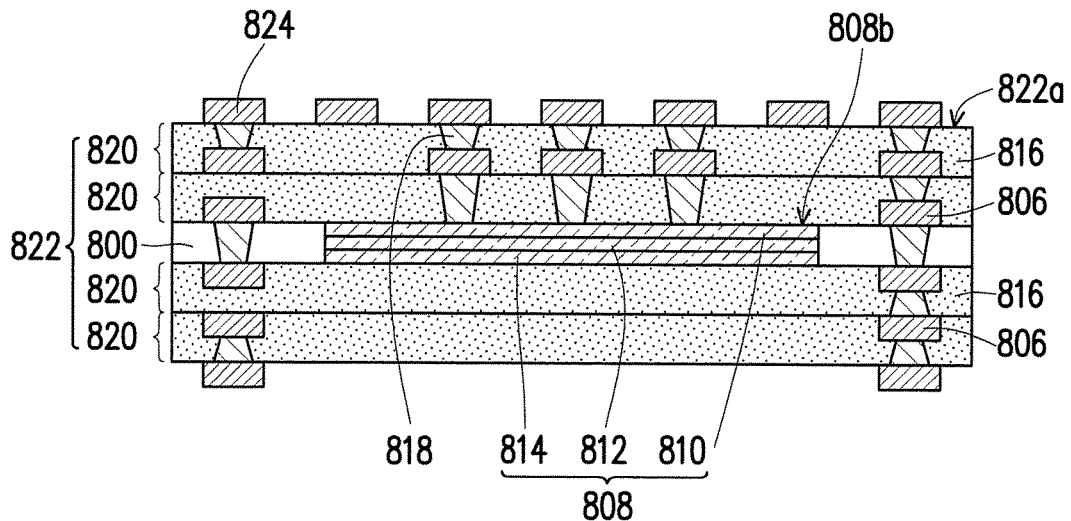

Next, referring to FIG. 8D, after repeating the build-up process once, the completed multilayer circuit board 822 has a heat conduction layer 808 embedded in the core board 800 with four build-up boards 820. Of course, if the location of the heat conduction layer 808 is changed, then a step of embedding the heat conduction layer 808 can also be suitably added based on the process of FIG. 8A to FIG. 8C above, and the heat conduction layer 808 can also be a single-layer structure. Since a blind via process or a through hole process is performed following the time the build-up process is performed, the vias (i.e. 818) located in different layers may be inter-connected. Therefore, after the build-up process, a portion of the vias 818 passes through a surface 822a of the multilayer circuit board 822 and is connected to a second surface 808b of the heat conduction layer 808, and other portion of the vias is functioned as circuits in the multilayer circuit board 822 without connecting to the second surface 808b of the heat conduction layer 808. The material of the vias 818 can be a metal containing copper or other conductive materials or a non-metallic material. Next, a plurality of bonding pads 824 is formed on the surface 822a of the multilayer circuit board 822.

Figure 8E:
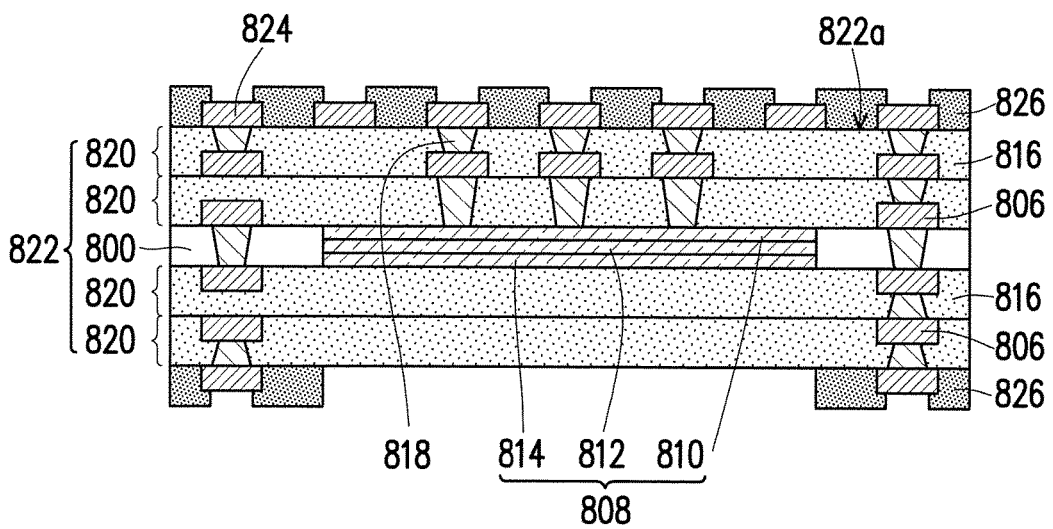

Next, referring to FIG. 8E, a solder mask 826 can be formed as needed, wherein the solder mask 826 covers the surface 822a of the multilayer circuit board 822 and exposes the surface of each of the bonding pads 824. In another embodiment, the step of FIG. 8E can be omitted to directly perform the next step.

Figure 8F:
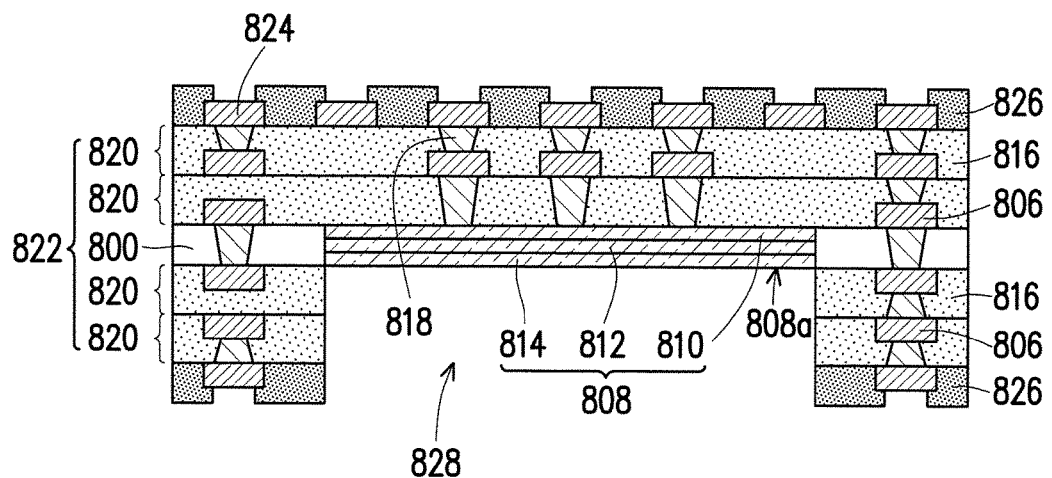

Next, referring to FIG. 8F, a cavity structure 828 opposite to the heat conduction layer 808 is formed in the multilayer circuit board 822 by a method such as laser or mechanical drilling to expose an entire first surface 808a of the heat conduction layer 808. In another embodiment, the cavity structure 828 can also only expose a portion of the first surface 808a of the heat conduction layer 808.

Figure 8G:
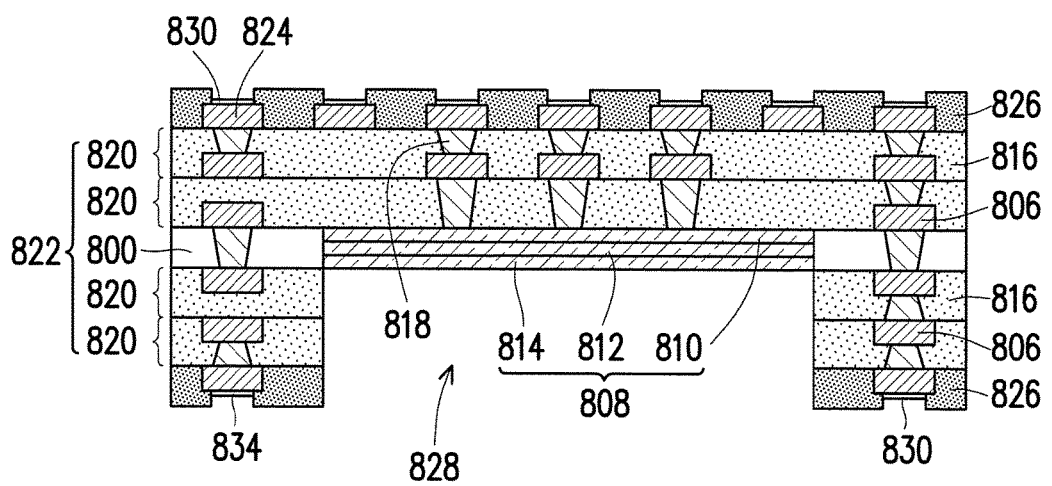
Figure 8H:
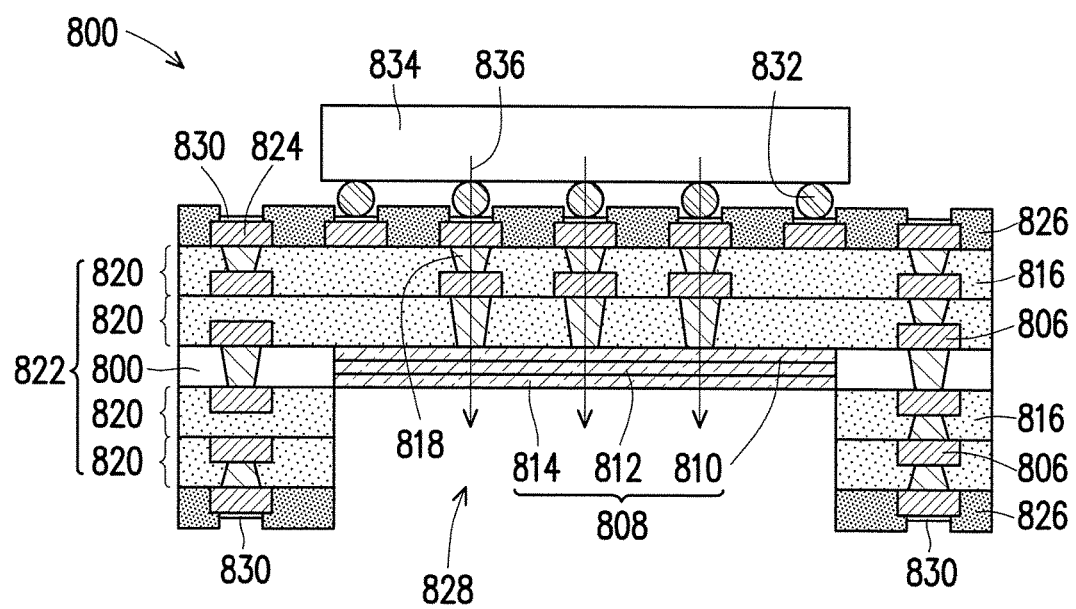
FIG. 8H is a package schematic using the heat dissipation substrate structure of the seventh embodiment.

Next, referring to FIG. 8G, an antioxidant layer 830 can be formed on the surface of each of the bonding pads 824 as needed. In another embodiment, the step of FIG. 8G can be omitted to directly perform the next step.

Lastly, referring to FIG. 8H, a device 834 is bonded to the bonding pads 824 through bonding materials 832 formed on thereof resulting in forming a heat dissipation path 836 from the device 834 through the bonding materials 832, the bonding pads 824, and the vias 818 to the heat conduction layer 808. The bonding materials 832 are, for instance, solder balls.

Since in the seventh embodiment, heat flow generated by the heating device 834 is transferred to the vias 818 in the multilayer circuit board 822 via the bonding materials 832 and then transferred to the heat conduction layer 808 for heat dissipation, the heat dissipation layer 808 can rapidly release the heat flow to the environment to prevent the accumulation of a large amount of heat in the device 834 and the multilayer circuit board 822. Moreover, the device 834 can also be connected to a circuit in the multilayer circuit board 822 via portions of the bonding materials 832 to achieve the function of signal transmission.

Figure 9A:
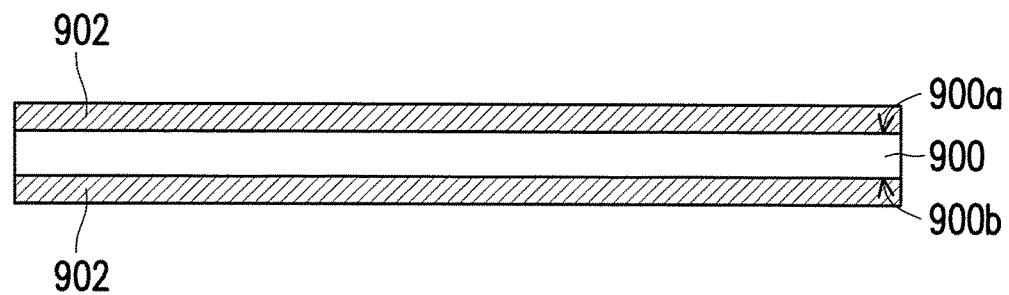
FIG. 9A to FIG. 9G are cross sections of the manufacturing process of a heat dissipation substrate structure according to the eighth embodiment of the invention.
Figure 9B:
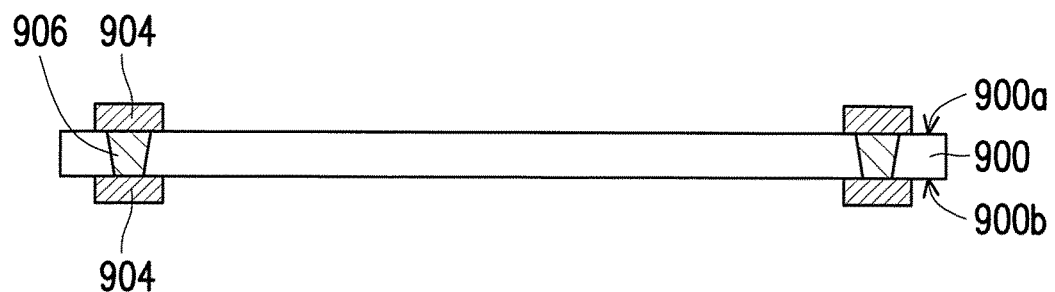
Figure 9C:
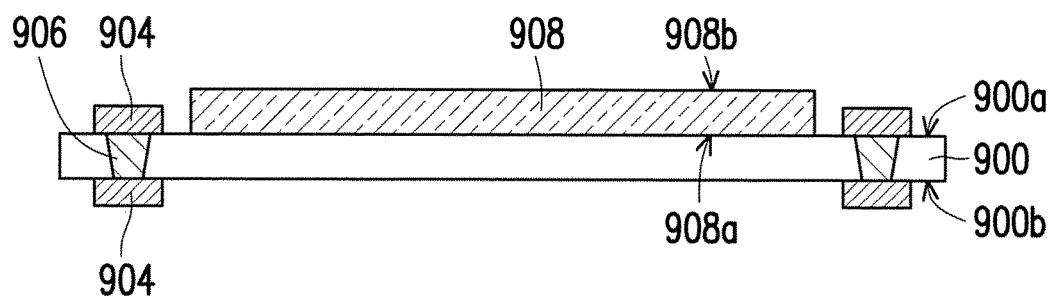
Figure 9D:
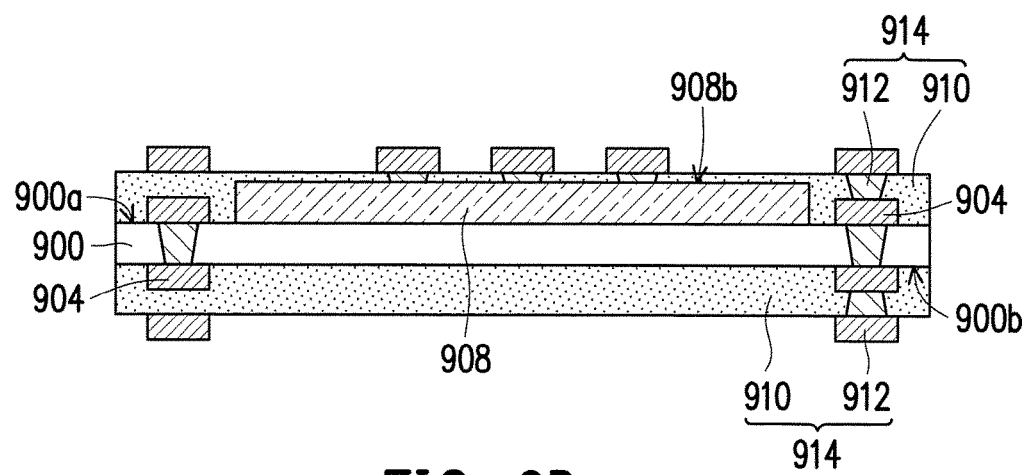
Figure 9E:
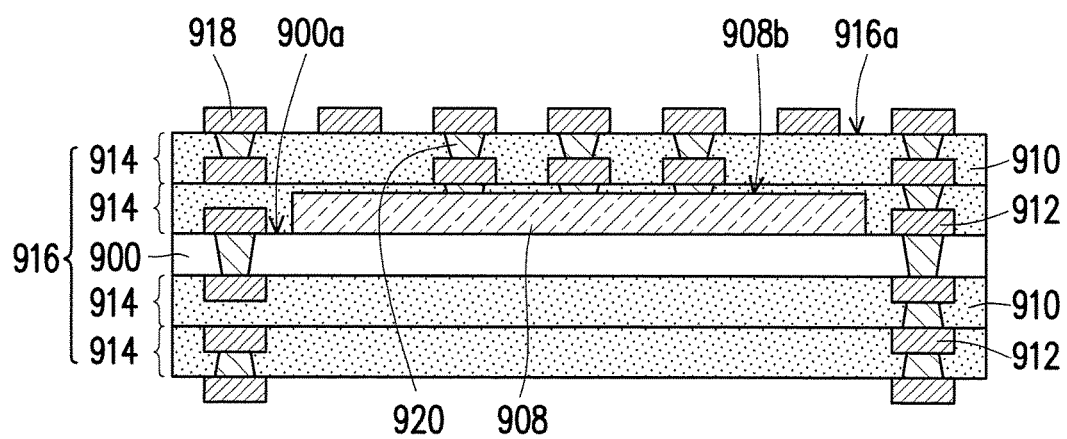
Figure 9F:
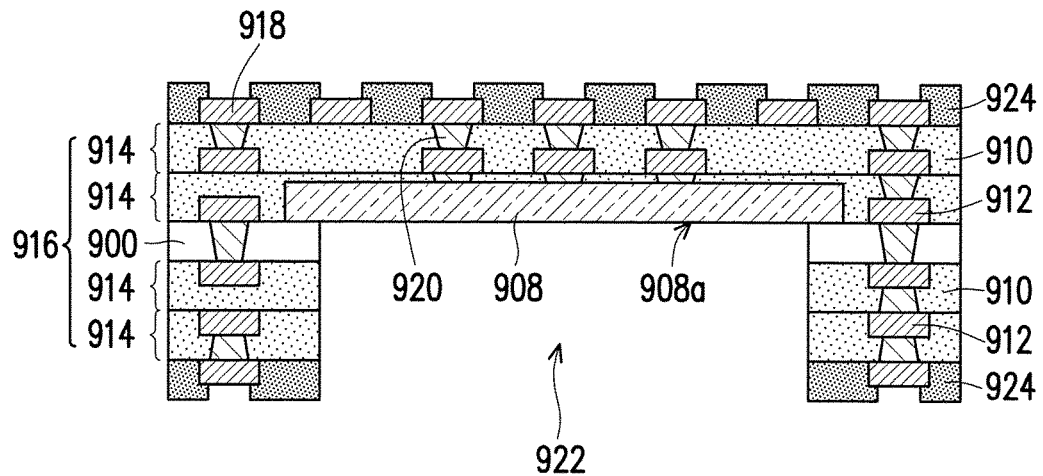
Figure 9G:
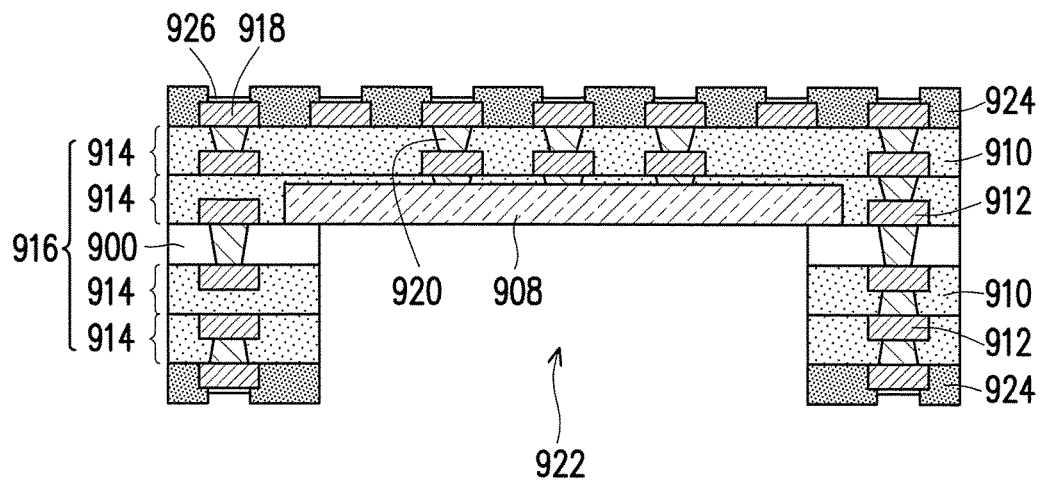
Figure 9H:
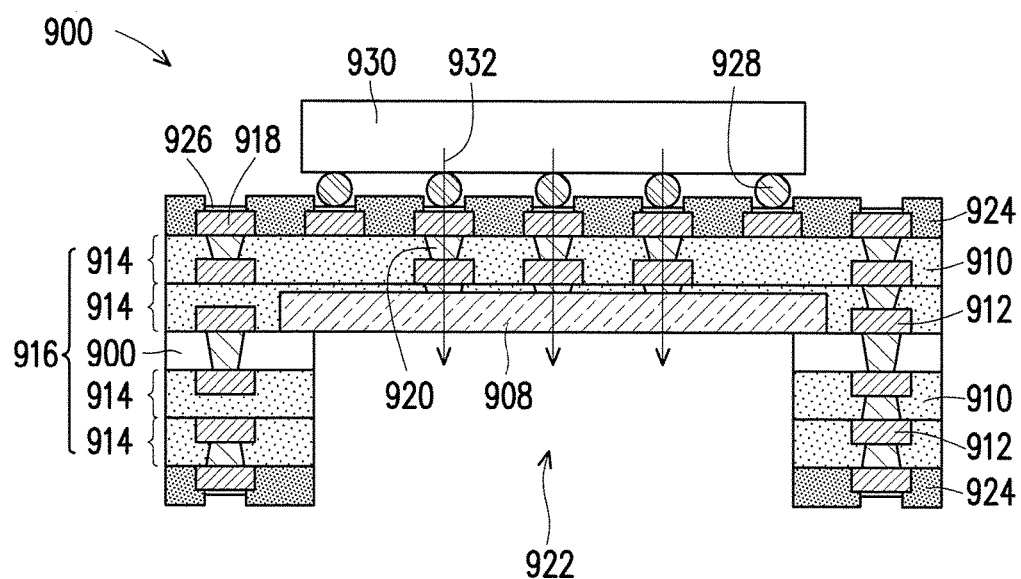
FIG. 9H is a package schematic using the heat dissipation substrate structure of the eighth embodiment.

FIG. 9A to FIG. 9G are cross sections of the manufacturing process of a heat dissipation substrate structure according to the eighth embodiment of the invention; and FIG. 9H shows a packaging schematic using the heat dissipation substrate structure of the eighth embodiment.

Referring first to FIG. 9A, one core board 900 is prepared, and a conductive material layer 902 is respectively built-up on surfaces 900a and 900b thereof. The conductive material layer 902 can be a metal including copper or other conductive materials including metallic or non-metallic material.

Next, referring to FIG. 9B, a circuit 904 is formed on the surfaces 900a and 900b of the core board 900 using a patterning process with a blind hole process or a through hole process, and vias 906 are formed in the core board 900. The manufacture in the steps of the present figure can be implemented by well-known technique.

Next, referring to FIG. 9C, a heat conduction layer 908 having a single-layer structure is formed on the surface 900a of the core board 900, wherein a second surface 908b of the heat conduction layer 908 is exposed, and a first surface 908a of the heat conduction layer 908 is in contact with the surface 900a of the core board 900. The heat conduction layer 908 can be a material having electric conduction and heat conduction properties, such as a conductive metal such as gold, silver, aluminum, copper, or nickel or carbon compound; the heat conduction layer 908 can also be a material having insulation and heat conduction properties such as boron nitride, silicon carbide, aluminum nitride, aluminum oxide, diamond film, diamond aluminum composite, graphite aluminum composite, carbon fiber aluminum composite, silicon carbide aluminum composite, or a composite material of the above. Moreover, the heat conduction layer 908 can also be the multilayer structure in the seventh embodiment which is not repeated herein.

Next, referring to FIG. 9D, a build-up process is performed on two surfaces 900a and 900b of the core board 900 by using the dielectric material layer 910 and the conductive material layer 912 to form a plurality of build-up boards 914. The build-up process can contain the patterning process as shown in FIG. 9B and/or a blind via process or through hole process which is not repeated herein.

Next, referring to FIG. 9E, after repeating the build-up process once, the completed multilayer circuit board 916 has a heat conduction layer 908 formed on the surface 900a of the core board 900. Of course, if the location of the heat conduction layer 908 is changed, then a step of forming the heat conduction layer 908 can also be suitably added based on the process of FIG. 9A to FIG. 9D above. The method of forming the vias 920 includes stacking a plurality of single-layer blind holes located on different layers in the build-up process. Therefore, after the build-up, a plurality of vias 920 passing through a surface 916a of the multilayer circuit board 916 and connected to the second surface 908b of the heat conduction layer 908 is formed. Next, a plurality of bonding pads 918 is formed on the surface 916a of the multilayer circuit board 916.

Next, referring to FIG. 9F, a solder mask 924 can be formed as needed, wherein the solder mask 924 covers the surface of the multilayer circuit board 916 and exposes the surface of each of the bonding pads 918. In another embodiment, the present step can be omitted to directly perform the next step. Next, a cavity structure 922 opposite to the heat conduction layer 908 is formed in the multilayer circuit board 916 by a method such as laser or mechanical drilling to expose a portion of the first surface 908a of the heat conduction layer 908. If a material having higher rigidity is used as the heat conduction layer 908, then the structure can also achieve the effect of increasing the mechanical strength of the multilayer circuit board 916 having the cavity structure 922 design.

Next, referring to FIG. 9G, an antioxidant layer 926 can be formed on the surface of each of the bonding pads 918 as needed. In another embodiment, the present step can be omitted to directly perform the next step.

Lastly, referring to FIG. 9H, a device 930 is bonded to the bonding pads 918 through bonding materials 928 formed on thereof resulting in forming a heat dissipation path 932 from the device 930 through the bonding materials 928, the bonding pads 918, and the vias 920 to the heat conduction layer 908.

Figure 10A:
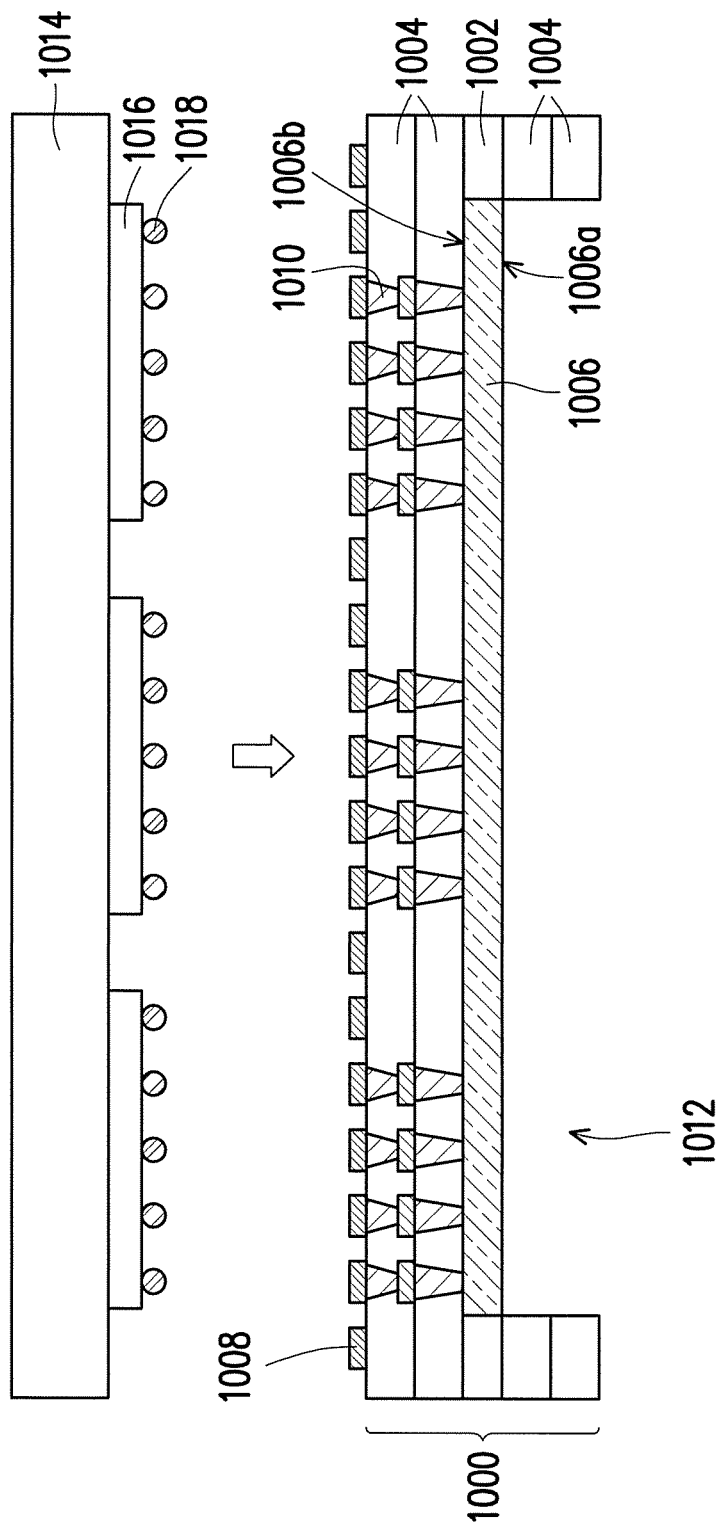
FIG. 10A to FIG. 10B are cross sections of a packaging process according to the ninth embodiment of the invention.
Figure 10B:
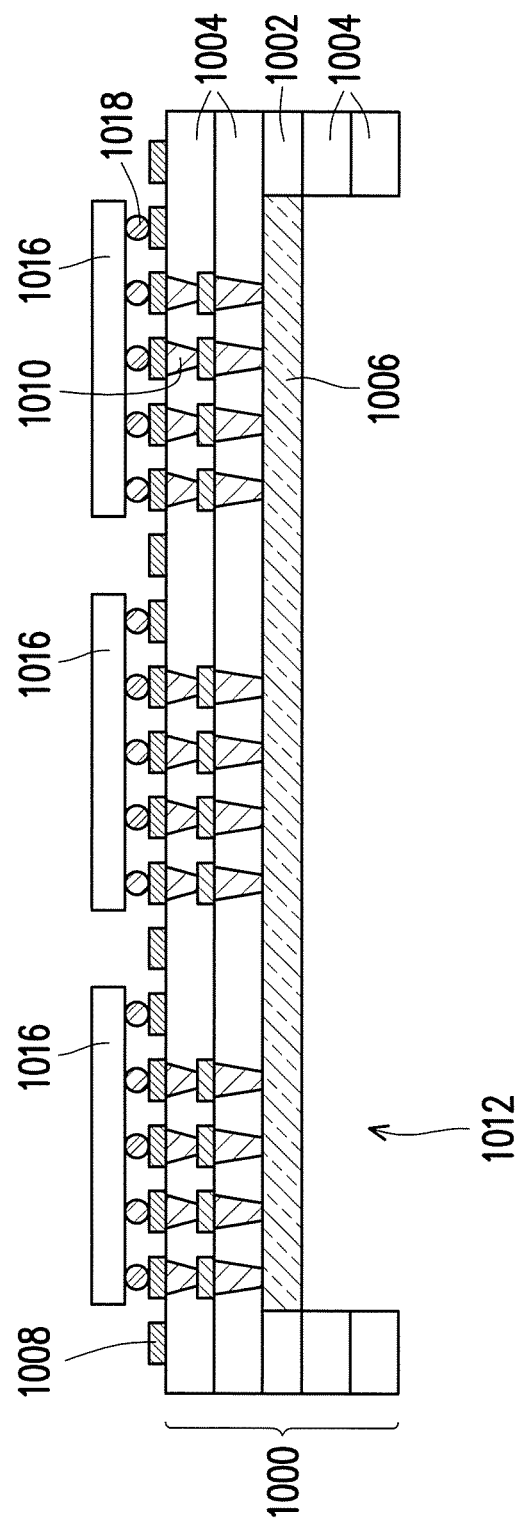

FIG. 10A to FIG. 10B are cross sections of a packaging process according to the ninth embodiment of the invention, and for clarity, some of the unnecessary components are omitted.

Referring first to FIG. 10A, a multilayer circuit board 1000 has a core board 1002 and a plurality of build-up boards 1004, and a heat conduction layer 1006 is embedded in the core board 1002. Bonding pads 1008 formed on a surface of the multilayer circuit board 1000 are coupled to a first surface 1006a of the heat conduction layer 1006 via through vias 1010 in the build-up boards 1004, and a cavity structure 1012 opposite to the heat conduction layer 1006 is formed in the multilayer circuit board 1000 to expose a second surface 1006b of the heat conduction layer 1006. Next, a plurality of devices 1016 can be bonded to the bonding pads 1008 through bonding materials 1018 formed on thereof at the same time by a micro-device conveying equipment 1014 using a mass production method. The resulting heat dissipation substrate structure is shown in FIG. 10B, wherein the plurality of devices 1016 is paired with one of the cavity structure 1012 and one of the heat conduction layer 1006, but the invention is not limited thereto; the manufacturing process of the ninth embodiment can also be applied in the manufacture of the heat dissipation substrate structure of FIG. 5 or FIG. 6.

Figure 11A:
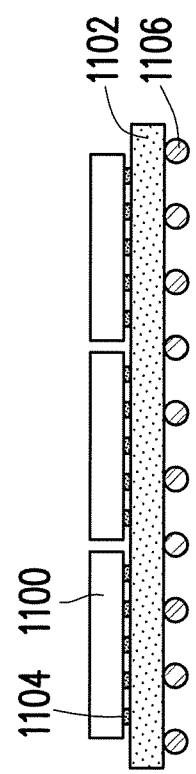
FIG. 11A to FIG. 11B are cross sections of a packaging process according to the tenth embodiment of the invention.
Figure 11B:
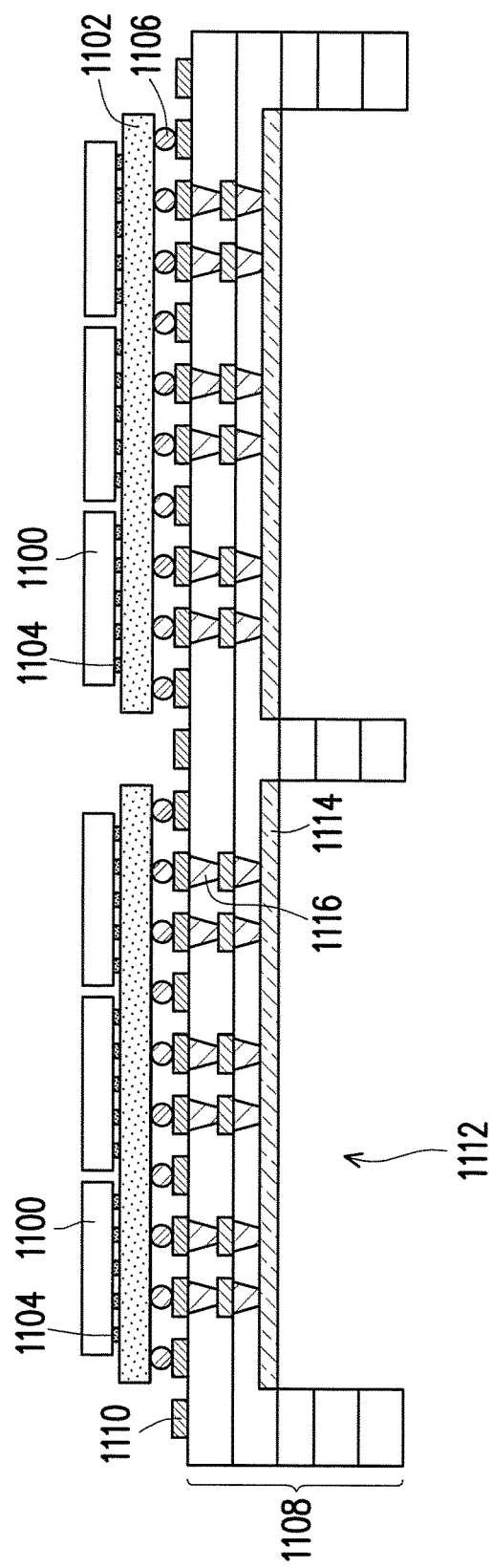

FIG. 11A to FIG. 11B are cross sections of a packaging process according to the tenth embodiment of the invention, and for clarity, some of the components are omitted.

Referring first to FIG. 11A, a plurality of devices 1100 is bonded on a surface of a carrier board 1102 via contacts 1104, and the other surface of the carrier board 1102 has a plurality of bonding materials 1106. The carrier board 1102 is similar to a small circuit board and therefore can have circuits (not shown) and bonding materials 1106 such as solder balls.

Next, referring to FIG. 11B, the solder balls 1106 are bonded to bonding pads 1110 of a multilayer circuit board 1108. Since a cavity structure 1112, a heat conduction layer 1114, and vias 1116 are formed in the multilayer circuit board 1108, based on the method of the present embodiment, the more complex device-end process and backend packaging process can be separately performed, and then bonding is performed by a simple packaging technique such as ball grid array (BGA) packaging.

Based on the above, in the invention, a heat conduction layer is added inside a multilayer circuit board, and a heating device is bonded to bonding pads located on the multilayer circuit board surface via bonding materials, and the bonding pads and the heat conduction layer are connected by through vias. At the same time, a cavity structure exposing the heat conduction layer surface is fonned on the opposite surface of the device such that the heat conduction layer is completely or partially exposed to the environment via the cavity structure. Therefore, the structure of the invention can transfer the heat flow generated by the device from the bonding materials, bonding pads, and through vias to the heat conduction layer, and then transfer the heat flow from the heat conduction layer to the environment. As a result, not only can heat flow transfer distance be reduced, the heat conduction layer can also rapidly release the heat flow to the environment to prevent the accumulation of a large amount of heat in the device and the multilayer circuit board from affecting the operation of an electronic product. Moreover, if a heat conduction layer material having higher rigidity is used with a design in which the heat conduction layer is partially exposed to the environment, then the structure can also achieve the effect of increasing the multilayer circuit board rigidity having a cavity structure design. Moreover, since the location of the device and the cavity structure are respectively on different surfaces of the multilayer circuit board, when the heat dissipation substrate of the invention is applied in an LED display panel or the like, in addition to heat dissipation effects, since the surface on which the devices (such as LED devices) are placed is flat without cavities, the devices can be densely arranged on the same surface to achieve the effect of uniform display brightness.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A heat dissipation substrate structure, comprising:
a multilayer circuit board comprising a core board and a plurality of build-up boards, wherein each of the build-up boards is respectively disposed on two surfaces of the core board;
at least one heat conduction layer embedded in the core board, the heat conduction layer has a first surface and a second surface opposite to the first surface, and the first surface and the second surface are coplanar with two surfaces of the core board respectively;
at least one cavity structure formed in the multilayer circuit board with respect to the at least one heat conduction layer and exposing the first surface of the at least one heat conduction layer;
a plurality of bonding pads disposed on a surface of the multilayer circuit board at a side of the second surface of the at least one heat conduction layer; and
a plurality of vias formed in the multilayer circuit board, wherein at least a portion of the vias is connected to a portion of the bonding pads and the second surface of the at least one heat conduction layer.

2. The heat dissipation substrate structure of claim 1, wherein the vias comprise blind holes or through holes.

3. The heat dissipation substrate structure of claim 1, wherein a size of the at least one cavity structure is the same as an area of the first surface of the at least one heat conduction layer.

4. The heat dissipation substrate structure of claim 1, wherein the first area of the at least one heat conduction layer is greater than a size of the at least one cavity structure.

5. The heat dissipation substrate structure of claim 1, wherein the at least one heat conduction layer is a single-layer structure or a multilayer structure.

6. The heat dissipation substrate structure of claim 1, wherein the at least one heat conduction layer and the at least one cavity structure comprise one of the heat conduction layer paired with a plurality of the cavity structure.

7. The heat dissipation substrate structure of claim 1, wherein the at least one heat conduction layer and the at least one cavity structure comprise a plurality of the heat conduction layer paired with a plurality of the cavity structure, and each of the heat conduction layers is paired with one of the cavity structure.

8. The heat dissipation substrate structure of claim 1, wherein each of the plurality of build-up boards comprises a dielectric material layer and a conductive material layer.

9. A package structure, comprising:
a heat dissipation substrate structure, comprising:
a multilayer circuit board comprising a core board and a plurality of build-up boards, wherein each of the build-up boards is respectively disposed on two surfaces of the core board;
at least one heat conduction layer embedded in the core board, the heat conduction layer has a first surface and a second surface opposite to the first surface, and the first surface and the second surface are coplanar with two surfaces of the core board respectively;
at least one cavity structure formed in the multilayer circuit board with respect to the at least one heat conduction layer and exposing the first surface of the at least one heat conduction layer;
a plurality of bonding pads disposed on a surface of the multilayer circuit board at a side of the second surface of the at least one heat conduction layer; and
a plurality of vias formed in the multilayer circuit board, wherein at least a portion of the vias is connected to a portion of the bonding pads and the second surface of the at least one heat conduction layer;
at least one device disposed on the multilayer circuit board at a side of the second surface of the at least one heat conduction layer with respect to the at least one cavity structure of the heat dissipation substrate structure; and
a plurality of bonding materials disposed on a surface of the at least one device facing the multilayer circuit board and connected to the plurality of bonding pads.

10. The package structure of claim 9, wherein the at least one device and the at least one cavity structure comprise a plurality of the device with one of the cavity structure.

11. The package structure of claim 9, wherein the at least one device and the at least one cavity structure comprise a plurality of the device paired with a plurality of the cavity structure, and each of the devices is paired with one of the cavity structure.

12. The package structure of claim 9, further comprising a carrier board between a plurality of the device and the bonding materials to carry the plurality of devices, wherein the carrier board is connected to the plurality of bonding pads through the bonding materials.

13. A manufacturing method of a heat dissipation substrate, comprising:
embedding at least one heat conduction layer in a core board, wherein the at least one heat conduction layer has a first surface and a second surface opposite to the first surface, such that the first surface and the second surface are coplanar with two surfaces of the core board respectively;
forming a plurality of build-up boards respectively on the two surfaces of the core board to form a multilayer circuit board;
forming a plurality of vias passing through a surface of the multilayer circuit board, wherein a portion of the vias is connected to the second surface of the at least one heat conduction layer;
forming a plurality of bonding pads on the surface of the multilayer circuit board, wherein each of the bonding pads is connected to the portion of the vias; and
forming at least one cavity structure in the multilayer circuit board with respect to the at least one heat conduction layer to expose the first surface of the at least one heat conduction layer.

14. The manufacturing method of the heat dissipation substrate of claim 13, wherein a method of forming the plurality of vias comprises a blind via process or a through hole process.

15. The manufacturing method of the heat dissipation substrate of claim 13, wherein forming the at least one cavity structure comprises exposing an entirety of the first surface of the at least one heat conduction layer.

16. The manufacturing method of the heat dissipation substrate of claim 13, wherein forming the at least one cavity structure comprises exposing a portion of the first surface of the at least one heat conduction layer.

17. The manufacturing method of the heat dissipation substrate of claim 13, wherein the heat conduction layer is a single-layer structure or a multilayer structure.

18. A packaging method, comprising:
embedding at least one heat conduction layer in a core board, wherein the at least one heat conduction layer has a first surface and a second surface opposite to the first surface, such that the first surface and the second surface are coplanar with two surfaces of the core board respectively;
forming a plurality of build-up boards respectively on the two surfaces of the core board to form a multilayer circuit board;
forming a plurality of vias passing through a surface of the multilayer circuit board, wherein a portion of the vias is connected to the second surface of the at least one heat conduction layer;
forming a plurality of bonding pads on the surface of the multilayer circuit board, wherein each of the bonding pads is connected to the portion of the vias;
forming at least one cavity structure in the multilayer circuit board with respect to the at least one heat conduction layer to expose the first surface of the at least one heat conduction layer; and
bonding at least one device to the plurality of bonding pads through a plurality of bonding materials formed on thereof for forming a heat dissipation path from the at least one device through the bonding materials, the bonding pads, and the vias to the at least one heat conduction layer.

19. The packaging method of claim 18, wherein when the at least one device is a plurality of devices, a method of bonding the at least one device to the plurality of bonding pads comprises bonding the plurality of devices on the plurality of bonding pads of the multilayer circuit board at the same time using a mass production method.

20. The packaging method of claim 18, wherein when the at least one device is a plurality of devices, a method of bonding the at least one device to the plurality of bonding pads comprises bonding the plurality of devices to a carrier board, wherein the carrier board has a plurality of solder balls as the bonding materials; and bonding the plurality of solder balls on the plurality of bonding pads of the multilayer circuit board.

* * * * *